United States Patent

Nakata et al.

Patent Number: 5,796,116
Date of Patent: Aug. 18, 1998

[54] THIN-FILM SEMICONDUCTOR DEVICE INCLUDING A SEMICONDUCTOR FILM WITH HIGH FIELD-EFFECT MOBILITY

[75] Inventors: Yukihiko Nakata, Nara; Masaki Fujihara; Masahiro Date, both of Tenri; Takuya Matsuo, Tondabayashi; Michiteru Ayukawa; Takashi Itoga, both of Nara, all of Japan

[73] Assignee: Sharp Kabushiki Kaisha, Osaka, Japan

[21] Appl. No.: 506,692

[22] Filed: Jul. 25, 1995

[30] Foreign Application Priority Data

Jul. 27, 1994 [JP] Japan ............... 6-175776
Jul. 27, 1994 [JP] Japan ............... 6-175777
Sep. 21, 1994 [JP] Japan ............... 6-227028

[51] Int. Cl.$^6$ .................................. H07L 29/786
[52] U.S. Cl. ............................ 257/66; 257/72
[58] Field of Search ................ 257/64, 66, 72, 257/75

[56] References Cited

U.S. PATENT DOCUMENTS

| | | | |
|---|---|---|---|
| 4,322,253 | 3/1982 | Pankove et al. | 257/75 |
| 4,464,415 | 8/1984 | Yamazaki | 427/39 |
| 4,581,620 | 4/1986 | Yamazaki et al. | 257/66 |
| 4,814,842 | 3/1989 | Nakagawa et al. | 257/66 |
| 4,835,059 | 5/1989 | Kodato | 257/347 |
| 4,920,917 | 5/1990 | Nakatani et al. | 118/718 |
| 5,017,308 | 5/1991 | Iijima et al. | 257/52 |
| 5,313,077 | 5/1994 | Yamazaki | 257/66 |
| 5,315,132 | 5/1994 | Yamazaki | 257/66 |
| 5,318,919 | 6/1994 | Noguchi et al. | 257/66 |
| 5,340,999 | 8/1994 | Takeda et al. | 257/66 |
| 5,367,180 | 11/1994 | Asai et al. | 257/66 |
| 5,473,168 | 12/1995 | Kawai et al. | 257/64 |
| 5,481,121 | 1/1996 | Zhang et al. | 257/72 |
| 5,576,555 | 11/1996 | Yamanobe et al. | 257/53 |

FOREIGN PATENT DOCUMENTS

| | | |
|---|---|---|
| A-0062079 | 10/1982 | European Pat. Off. |
| 0344863 | 12/1989 | European Pat. Off. |
| A-0526779 | 2/1993 | European Pat. Off. |
| 0592227 | 4/1994 | European Pat. Off. |
| 59-141271 | 8/1984 | Japan |
| 60-98680 | 6/1985 | Japan |
| 61-59873 | 3/1986 | Japan |
| 61-79259 | 4/1986 | Japan |
| 63-168052 | 7/1988 | Japan |
| 1-173640 | 7/1989 | Japan |
| 1-32661 | 7/1989 | Japan |
| 2-159021 | 6/1990 | Japan |
| 4-137525 | 5/1992 | Japan |
| 4-54375 | 8/1992 | Japan |
| 4-266019 | 9/1992 | Japan |

OTHER PUBLICATIONS

H. Shirai et al., Jpn. J. Appl. Phys., 30(4B)(1991) L679 "Role of Atomic Hydrogen During Growth of Hydrogenated Amorphous Silicon in the 'Chemical Annealing'".

H. Shirai et al., Tech. Digest of Int'l. PVSEC-5 (Kyoto, Japan, 1990), Session A–lpB–2, "The Concept of 'Chemical Anealing' for the Improvement of the Stability in Si-network".

D. Das et al., Jpn. J. Appl. Phys., 30(2B)(1991) L239, "narrow Band–Gap a Si:H with Improved Minority Carrier–Transport Prepared by Chemical Annealing".

(List continued on next page.)

*Primary Examiner*—David B. Hardy
*Attorney, Agent, or Firm*—Nixon & Vanderhye, PC

[57] ABSTRACT

A thin film transistor includes: a substrate; a gate electrode, a source electrode and a drain electrode formed above the substrate; and an insulating film and a semiconductor film formed between the gate electrode, and the source electrode and the drain electrode, wherein the semiconductor film includes an i-type silicon film, and a portion or the semiconductor film within 50 nm from the insulating film has a microcrystalline structure having a conductivity of $5 \times 10^{-10}$ S/cm or more.

7 Claims, 14 Drawing Sheets

OTHER PUBLICATIONS

Otobe et al, "Preparation of Microcrystalline Silicon Films by Very–High–Frequency Digital Chemical Vapor Deposition", Jpn. J. Appl. Phys., vol. 31, pp. 1948–1952, 1992.

Nomoto et al, "Role of Hydrogen Atoms in the Formation Process of Hydrogenated Microcrystalline Silicon", Japanese Journal of Applied Physics, vol. 29, No. 8, pp. L1372–L1375, 1990.

Nakazawa et al, "Polycrystalline Silicon Film Formation at Low Temperature Using a Microcrystalline Silicon Film", Japanese Journal of Applied Physics, vol. 28, No. 4, pp. 569–572, 1989.

Johnson et al, "Hydrogen Incorporation in Undoped Microcrystalline Silicon", Appl. Phys. Lett., vol. 53, No. 17, pp. 1626–1627, 1988.

Miyazaki et al, "Effects of Growth Rate on the Microcrystalline Characteristics of Plasma–Deposited μc–Si:H", Solar Energy Materials, vol. 11, pp. 85–95, 1984.

Matsuda, "Formation Kinetics and Control of Microcrystalline In μc–Si:H From Glow Discharge Plasma", Journal of Non–Crystalline Solids, 50 & 60, pp. 767–774, 1983.

Patent Abstracts of Japan, vol. 014, No. 005 (E–869), 9 Jan. 1989 & JP 01 253271A (Fuji Electric Co Ltd), 9 Oct. 1989.

Patent Abstracts of Japan, vol. 012, No. 153 (E–607), 11 Mei 1988 & JP 62 268128 A (Sharp Corp), 20 Nov. 1987.

Shen et al, "Thin Boron Doped Microcrystalline Silicon Films", Solar Energy Materials and Solar Cells, vol. 30, NR.2, pp. 139–145, 1 Jul. 1993, XP000381983.

Wang et al, "The Preparation of Microcrystalline Silicon (UC–SI) Thin Films by Remote Plasma–Enhanced Chemical Vapor Deposition", 1 Mei 1991, Journal of Vacuum Science and Technology: Part A, vol. 9, NR. 3 Part 01, pp. 444–449 XP000359393.

Rajeswaran et al, "Substrate Temperature Dependence of Microcrystallinity in Plasma–Deposited, Boron–Doped Hydrogenated Silicon Alloys", Applied Physics Letters, 1 Dec. 1983, USA, vol. 43, NR. 11, pp. 1045–1047.

RF power $H_2$ (valve 55)

$SiH_4$ (valves 43,44)

Deposition time    Hydrogen plasma treatment time

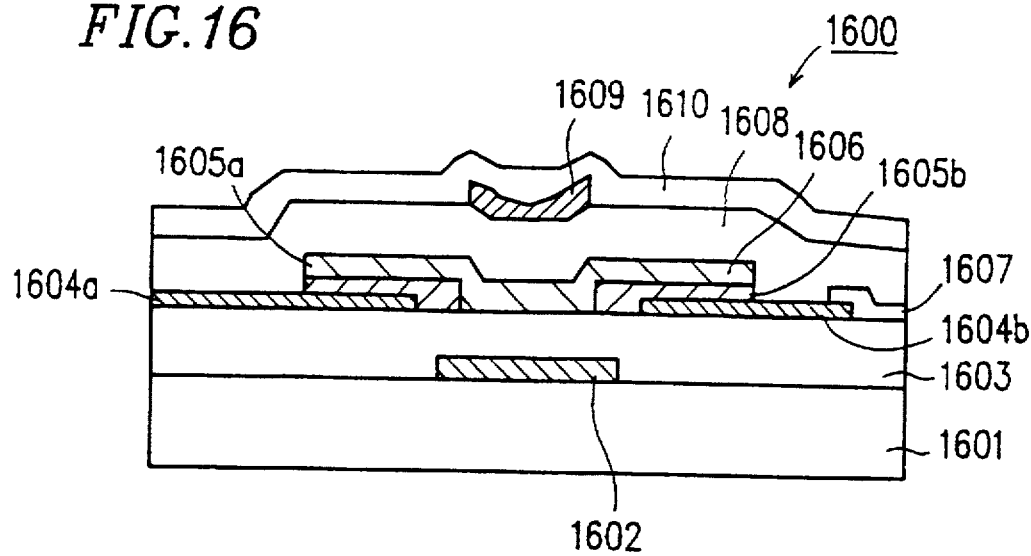
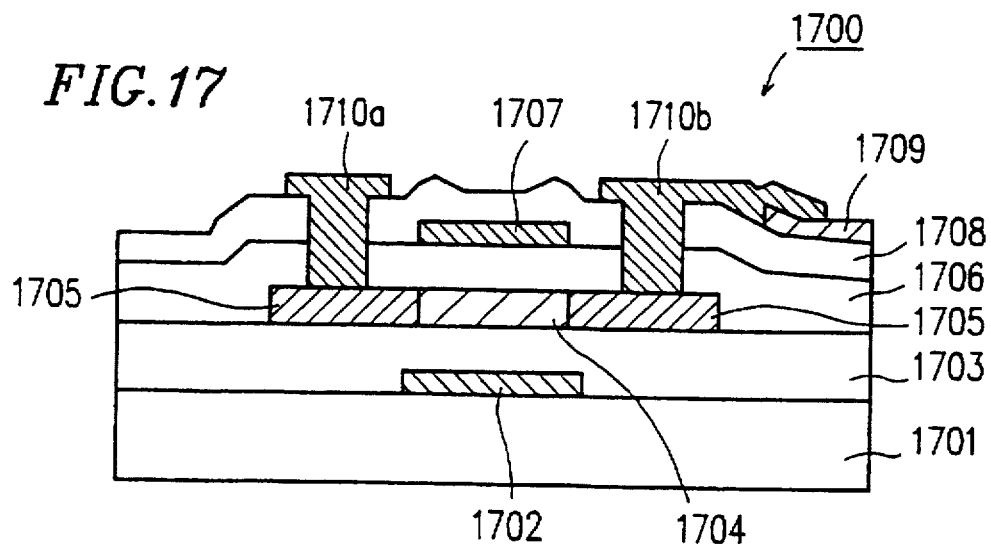

THIN-FILM SEMICONDUCTOR DEVICE INCLUDING A SEMICONDUCTOR FILM WITH HIGH FIELD-EFFECT MOBILITY

BACKGROUND OF THE INVENTION

1. Field of the Invention

The present invention relates to a thin-film semiconductor device and a method for fabricating the same. More specifically, the present invention relates to a thin-film semiconductor device, such as a thin-film transistor, applicable to a liquid crystal display device using a thin-film transistor (TFT-LCD), and a method for fabricating the same.

2. Description of the Related Art

A conventional thin-film semiconductor device will be described by illustrating a thin-film transistor (hereinafter, simply referred to as a TFT) as an example. In addition, a method for producing a conventional TFT will be described by reference to FIGS. 20 and 21.

FIG. 20 is a cross-sectional view of a conventional TFT 2000 having a reversed stagger structure. The TFT 2000 includes: a gate electrode 2002; a gate insulating film 2003; an intrinsic amorphous silicon (an i-type a-Si) thin film 2004; a channel protection film 2005, and an n-type amorphous silicon (an n-type a-Si) thin film 2006 consisting a source region 2006a and a drain region 2006b. These films are formed in this order on an Insulating substrate 2001. A source electrode 2007a and a drain electrode 2007b are respectively formed on a predetermined region of the source region 2006a and the drain region 2006b of the n-type a-Si thin film 2006. A pixel electrode 2008 connected to either the source electrode 2007a or the drain electrode 2007b is further formed on one of the electrodes 2007a and 2007b.

In this conventional TFT 2000 shown in FIG. 20, the n-type a-Si thin film 2006 is formed by a plasma chemical vapor deposition (P-CVD) method so as to cover the channel protection film 2005. Thereafter, the n-type a-Si thin film 2006 is patterned in a predetermined shape as shown in FIG. 20.

A TFT having a similar structure to that shown in FIG. 20 is disclosed in Japanese Laid-Open Patent Publication Nos. 59-141271, 61-59873, and 60-98680. In the TFT disclosed in these patent publications, a microcrystalline silicon (go-Si) thin film is used. Japanese Laid-Open Patent Publication No. 59-141271 discloses a TFT in which a gate insulating film has a double-layered structure consisting of a film formed by anodizing a metallic film which is used as a gaze electrode and an insulating film formed by a P-CVD method, and a µc-Si film which is used as a semiconductor layer.

Japanese Laid-Open Patent Publication No. 61-59873 discloses a TFT having a reversed stagger structure in which a double-layered semiconductor layer is used as an i-type semiconductor layer. The semiconductor layer having the double-layered structure consists of an a-Si film provided as a first layer in order to prevent the damage caused by the glow-discharge of high power and a µc-Si film provided as a second layer in order to improve field-effect mobility. However, a channel portion of the TFT is formed in the a-Si film. Therefore, even if the structure disclosed in this patent publication is used, it is also difficult to improve field-effect mobility.

In addition, since the thickness of the second layer, i.e., the µc-Si film, is required to be 100 nm, the throughput is reduced. This is because the deposition of the µc-Si film with a thickness of 100 nm is required to be performed for about 2000 seconds in the case of using a typical deposition rate.

Japanese Laid-Open Patent Publication No. 60-98680 discloses a TFT in which an i-type semiconductor layer has a double-layered structure consisting of a µc-Si film with a thickness or 15 nm or less as a first layer and an amorphous semiconductor layer having an energy gap larger than that of the first layer as a second layer. In this structure, the throughput is also reduced. Moreover, since other materials are added to the semiconductor film having a larger band gap, it is difficult to obtain a semiconductor film of a satisfactory quality and improve the field-effect mobility.

FIG. 21 is a cross-sectional shoving another conventional TFT 2100 having a reversed stagger structure. The TFT 2100 shown in FIG. 21 includes: a gate electrode 2102; a gate insulating film 2103; an intrinsic semiconductor thin film 2104; a channel protection film 2105; and an n-type semiconductor layer 2106 consisting of a source region 2106a and a drain region 2106b. These films are formed in this order on an insulating substrate 2101 A source electrode 2107a and a drain electrode 2107b are respectively formed so as to partially cover the predetermined portion of the source region 2106a and the drain region 2106b of the n-type semiconductor layer 2106. A pixel electrode 2108 connected to either the source electrode 2107a or the drain electrode 2107b is further formed on one of the electrodes 2107a and 2107b.

In the TFT 2100 shown in FIG. 21, the n-type semiconductor layer 2106 is formed by discharge decomposing a gas containing an impurity such as hydrogen-diluted phosphine so as to generate ions, and implanting the ions into an intrinsic semiconductor thin film 2104 formed on the gate insulating film 2103 by using the channel protection film 2105 as a mask while applying an acceleration thereto.

In the case of fabricating the TFT shown in FIG. 20, the following problems occur. First, in order to form the n-type a-Si thin film 2006, it is necessary to perform additional process steps of depositing the n-type a-Si thin film 2006 by the P-CVD method so as to cover the channel protection film 2005 and patterning the n-type a-Si thin film 2006 so as to partially overlap with the channel protection film 2005. As a result, the number of the necessary process steps increases. In addition, in positioning a part or the n-type a-Si thin film 2006 on the channel protection film 2005, some margin of error is required, so that the channel length becomes disadvantageously longer and the amount of the ON current of the TFT 2000 is reduced.

In addition, since the field-effect mobility of the i-type a-Si film is small in the TFT 2000 shown in FIG. 20, the channel width can not be reduced in order to secure a sufficient amount of ON current, and it is difficult to downsize the TFT 2000. Therefore, in a liquid crystal panel using the TFT 2000 shown in FIG. 20, it is difficult to increase an opening ratio of the liquid crystal panel. As a result, in the case of using the TFT 2000, it is necessary to consume a larger amount of power of a back light in order to increase the brightness of a liquid crystal display.

Furthermore, when the TFT 2000 shown in FIG. 20 is seen from above, some overlapping region exists between the drain electrode 2007b and the gate electrode 2002. As a result, a parasitic capacitance is generated in the overlapping region and considerably affects the display quality Moreover, the quality of the TFT becomes inferior because of the existence of the residual dust on the insulating substrate 2001 during the deposition of the n-type a-Si thin file 2000, and the like, thereby adversely reducing the production yield of the TFT.

In fabricating the TFT 2100 shown in FIG. 21, as disclosed in Japanese Patent Publication Nos. 1-32661 and 4-54375, the n-type semiconductor layer 2106 including the source region 2106a and the drain region 2106b is formed by implanting the impurity ions into the intrinsic silicon semiconductor thin film 2104. Accordingly, the inferiority of the TFT generated during the deposition of the n-type a-Si thin film by the P-CVD method as described in connection with the TFT 2000 shown in FIG. 20 can be eliminated, and the reduction in the production yield can be prevented. In addition, in the TFT 2100 shown in FIG. 21, no overlapping portion exists between the channel protection film 2105 and the n-type semiconductor film 2106. Thus the channel length can be reduced without any need for considering a margin of error for positioning the channel protection film 2105 on the n-type semiconductor film 2106 unlike the TFT 2000 shown in FIG. 20. However, in the case of using an i-type a-Si film as a semiconductor layer, the field-effect mobility of the i-type a-Si film is small, so that the channel width can not be reduced even though the channel length can be reduced. Therefore, even by the use of the TFT 2100 shown in FIG. 21, it is difficult to downsize the TFT. Consequently, the TFT 2100 shown in FIG. 21 also has a similar problem to that or the TFT 2000 shown in FIG. 20 in that it is difficult to increase the opening ratio of the liquid crystal panel.

The electric resistance of an n-type semiconductor layer formed by implanting impurity ions into an i-type a-Si film or a silicon film including a microcrystalline structure of unsatisfactory quality is high, as is well known. As a result, in a case of using the n-type semiconductor layer thus foxed, a voltage drop occurs in the n-type semiconductor layer, so that the amount of the ON current of the TFT becomes insufficient. Therefore, even if the channel length of the TFT 2100 shown in FIG. 21 can be reduced, the amount of the ON current does not increase satisfactorily.

In addition, the electric resistance of the n-type semiconductor layer is set to be low in the TFT as disclosed in Japanese Laid-Open Patent publication No. 63-168052. Therefore, in a method in which a low-resistance silicide layer is separately formed, it is necessary to perform the additional process steps of depositing the low-resistance silicide layer and etching the suicide layer. Thus, the number of the process steps and the associated costs disadvantageously increase. Furthermore, the resistance of the silicide layer can not be sufficiently reduced, so that the amount of the ON current can not be effectively increased even if the channel length is reduced.

SUMMARY OF THE INVENTION

A thin film transistor according to an aspect of the invention includes: a substrate; a gate electrode, a source electrode and a drain electrode formed above the substrate, and an insulating film and a semiconductor film formed between the gate electrode, and the source electrode and the drain electrode. In the thin film transistor, the semiconductor film includes an i-type silicon film, and a portion of the semiconductor film within 50 nm from the insulating film has a microcrystalline structure with a conductivity of about $5 \times 10^{-10}$ S/c or more.

A thin film transistor according to another aspect of the invention includes: a substrate; a gate electrode, a source electrode and a chain electrode formed above the substrate; and an insulating film and a semiconductor film formed between the gate electrode, and the source electrode and the drain electrode. In the thin film transistor, the semiconductor film includes an i-type silicon film, and a portion of the semiconductor film within 50 nm from the insulating film has a microcrystalline structure with an amount of bound hydrogen of about 10% or less.

A thin film transistor according to still another aspect of the invention includes: a substrate; a gate electrode, a source electrode and a drain electrode formed above the substrate; and an insulating film and a semiconductor film formed between the gate electrode, and the source electrode and the drain electrode. In the thin film transistor, the semiconductor film includes an i-type silicon film, and a portion of the semiconductor film within 50 nm from the insulating film has a microcrystalline structure pith a crystalline volume fraction of about 10% or more.

A thin film transistor according to still another aspect or the invention includes a substrate; a gate electrode, a source electrode and a drain electrode formed above the substrate, and an insulating film and a semiconductor film formed between the gate electrode, and the source electrode and the drain electrode. In the thin film transistor, the semiconductor film includes an i-type silicon film, and a portion of the semiconductor film within 50 nm from the insulating film has a microcrystalline structure whose absorption coefficient for light hating a wavelength of 400 nm is $3.7 \times 10^5$ cm$^{-1}$ or less.

A thin film transistor according to still another aspect of the invention includes: a substrate; a gate electrode, a source electrode and a drain electrodes formed above the substrate; and an insulating film and a semiconductor film formed between the gate electrode, and the source electrode and the drain electrode. In the thin film transmitter, the semiconductor film includes an i-type silicon film, at least a portion of the semiconductor film within 50 nm from the insulating film has a microcrystalline structure in which a {111} axis of a plurality of crystalline grains is perpendicular to the substrate.

A thin film transistor according to still another aspect of the invention includes; a substrate; a gate electrode, a source electrode and a drain electrode formed above the substrate; and an insulating film and a semiconductor film formed between the gate electrode, and the source electrode and the drain electrode. In the thin film transistor, at least a portion of the semiconductor film has microcrystalline structure having a conductivity in a range of about $5 \times 10^{-10}$ S/cm to about $1 \times 10^{-7}$ S/cm.

In one embodiment, the semiconductor layer includes a film made of at least one of silicon, silicon germanium, silicon carbon, silicon nitride and silicon oxide.

A thin film transistor according to still another aspect of the invention includes: a substrate; a gate electrode, a source electrode and a drain electrode formed above the substrate; and an insulating film and a semiconductor film formed between the gate electrode, and the source electrode and the drain electrode. In the thin film transistor, the semiconductor film includes one of a p-type silicon film and an n-type silicon film, at least a portion of the semiconductor film within 50 nm from the insulating film has microcrystalline structure with a conductivity of about $1 \times 10^{-3}$ S/cm or more. According to still another aspect of the invention, a method for fabricating a thin film transistor is provided. The thin film transistor has a gate electrode, a source electrode and a drain electrode which are formed above a substrate, an insulating film and a semiconductor film formed between the gate electrode, and the source electrode and the drain electrode. The method includes a step of forming the semiconductor film including a microcrystalline structure by repeatedly performing steps of: forming a silicon layer on the insulating film by decomposing a material gas including Si which is introduced into a reaction chamber of a plasma chemical vapor deposition apparatus; and doing a hydrogen plasma treatment for the silicon layer by introducing a hydrogen gas into the reaction chamber.

In one embodiment, the method for fabricating a thin film transistor further includes a step of performing a hydrogen plasma treatment for the insulating layer prior to the step of forming the semiconductor film.

According to still another aspect of the invention, a method for fabricating a thin film transistor is provided. The thin film transistor has a gate electrode, a source electrode and a drain electrode which are formed above a substrate, an insulating film and a semiconductor film formed between The gate electrode, and the source electrode and the drain electrode. The method includes steps of: forming a silicon layer having a microcrystalline structure under a condition of a hydrogen dilution ratio of 200 or more, the hydrogen dilution ratio being defined as a ratio of 2 to $SiH_4$, the silicon layer having a thickness of about 10 nm or less; and forming, on the silicon layer, another silicon layer having a microcrystalline structure under a condition of the hydrogen dilution ratio of 2 to 200.

In one embodiment, the method for fabricating a thin film transistor further includes a step of doping impurity ions into the semiconductor film to form a pair of doped regions which are arranged at a predetermined space.

According to still another aspect of the invention, a method for fabricating a thin film transistor is provided. The thin film transistor has a gate electrode, a source electrode and a drain electrode which are formed above a substrate, an insulating film and a semiconductor film formed between the gate electrode, and the source electrode and the drain electrode. The method includes steps of: forming a silicon film as the semiconductor film having a microcrystalline structure under a condition of a hydrogen dilution ration of 30 or more, the hydrogen dilution ratio being defined as a ratio of $H_2$ to $SiH_4$; and forming a pair of doped regions arranged at a predetermined space in the semiconductor film by doping impurities into the semiconductor film by ion doping According to still another aspect of the invention, a semiconductor device is provided. The semiconductor device includes a semiconductor film. The semiconductor film includes an i-type silicon film which includes a micro-crystalline structure with a conductivity of about $5 \times 10^{-10}$ S/cm or more.

According to still another aspect of the invention, a semiconductor device is provided. The semiconductor device includes a semi-conductor film. The semiconductor film includes an i-type silicon film which includes a micro-crystalline structure with an amount of bound hydrogen of about 10% or less.

According to still another aspect of the invention, a semiconductor device is provided. The semiconductor device includes a semiconductor film. The semiconductor film includes an i-type silicon which includes a microcrystalline structure with a crystalline volume fraction of about 10% or more.

According to still another aspect of the invention, a semiconductor device is provided. The semiconductor device includes a semiconductor film. The semiconductor film includes an i-type silicon film having a microcrystalline structure whose absorption coefficient for light having a wavelength of 400 nm is $3.7 \times 10^5$ $cm^{-1}$ or less.

According to still another aspect of the invention, a semiconductor device is provided. The semiconductor device includes a semiconductor film formed of a substrate. The semiconductor film includes an i-type silicon film having a microcrystalline structure in which a $\{111\}$ axis of a plurality of crystalline grains is perpendicular to the substrate.

In one embodiment, the semiconductor film includes a pair of doped regions arranged at predetermined spaces, the doped regions including impurities doped by ion doping.

According to still another aspect of the invention, a semiconductor device is provided. The semiconductor device includes a semiconductor film including a p-type silicon film or an n-type silicon film which includes a microcrystalline structure with a conductivity is $1 \times 10^{-3}$ S/cm or more.

According to still another aspect of the invention, a method for fabricating a thin film semiconductor device including an i-type silicon film is provided. The method includes a step of forming the i-type silicon film including a microcrystalline structure by repeatedly performing steps of: forming a silicon layer on the insulating film by decomposing a material gas including Si which is introduced into a reaction chamber of a plasma chemical vapor deposition apparatus; and doing a hydrogen plasma treatment for the silicon layer by introducing a hydrogen gas into the reaction chamber.

In one embodiment, the method for fabricating a thin film semiconductor device further includes a step of doping impurities ion into the i-type silicon film to form a pair of doped regions which are arranged at a predetermined space.

In another embodiment, the method for fabricating a thin film semiconductor device further includes a step of performing a hydrogen plasma treatment prior to the step of forming the i-type silicon film.

In still another embodiment, the step of forming the silicon layer includes a step of forming the silicon layer to have a thickness in a range of about 0.1 nm to about 5 nm.

According to still another aspect of the invention, a method for fabricating a thin film semiconductor device including a silicon film is provided. The method includes steps of: forming a silicon layer having a microcrystalline structure under a condition of a hydrogen dilution ratio of 200 or more, the hydrogen dilution ratio being defined as a ratio of $H_2$ to $SiH_4$, the silicon layer having a thickness of about 10 nm or less; and forming, on the silicon layer, another silicon layer having a microcrystalline structure under a condition of the hydrogen dilution ratio of 2 to 200, whereby the silicon film is formed.

In one embodiment, the method for fabricating a thin film semiconductor device further includes a step or doping impurities ion into the silicon film to form a pair of doped regions which are arranged at a predetermined space.

According to still another aspect of the invention, a method for fabricating a thin film semiconductor device including a silicon film is provided. The method includes steps of: forming the silicon film to have a microcrystalline structure under a condition of a hydrogen dilution ration of 30 or more, the hydrogen dilution ratio being defined as a ratio of $H_2$ to $SiH_4$; and forming a pair of doped regions arranged at a predetermined space in the silicon film by doping impurities into the silicon film by ion doping.

According to still another aspect of the the invention, a method for fabricating a thin film transistor is provided. The thin film transistor includes: a semiconductor layer; a source region and a drain region which are in contact with the semiconductor film; a source electrode and a drain electrode electrically connected to the source region and the drain region, respectively; and a gate electrode insulated from the semiconductor film by a gate insulating film. The method includes a step of forming the semiconductor film so as to have a conductivity in a range of about $5 \times 10^{-10}$ S/cm to about $1 \times 10^{-7}$ S/cm.

Thus, the invention described herein makes possible the advantages or (1) providing a thin-film semiconductor device and a thin-film transistor in which the resistance value in the contact portion between an electrode and a semiconductor layer is considerably reduced; (2) providing a method for fabricating such a thin-film semiconductor device and a method for fabricating such a thin-film transistor by performing a smaller number of process steps; and (3) providing a thin-film semiconductor device including a semiconductor film with high field-effect mobility and a method for producing such a thin-film semiconductor device.

These and other advantages of the present invention will become apparent to those skilled in the art upon reading and understanding the following detailed description with reference to the accompanying figures.

BRIEF DESCRIPTION OF THE DRAWINGS

FIG. 16 is a cross-sectional view showing a TFT having a stagger structure according to still another example of the present invention.

FIG. 17 is a cross-sectional view showing a TFT having a coplanar structure according to still another example of the present invention.

DESCRIPTION TO THE PREFERRED EMBODIMENTS

Hereinafter, the present invention will be described by way of illustrative examples with reference to accompanying drawings

EXAMPLE 1

Figure 1:
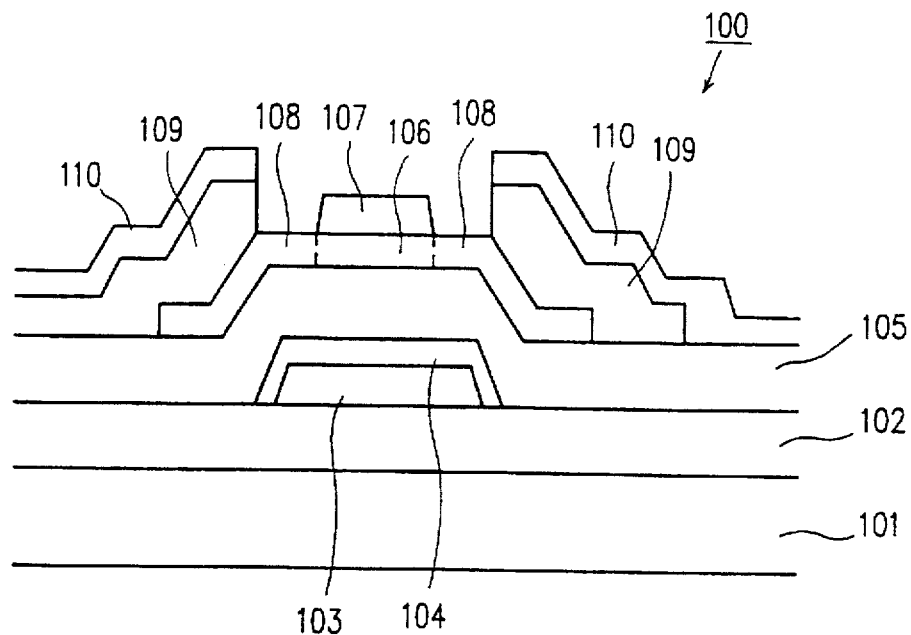
FIG. 1 is a cross-sectional view showing a TFT having a reversed staggered structure according to an example of the present invention.

FIG. 1 is a cross-sectional view of a TFT having a reversed stagger structure according to the present invention The TFT 100 is formed on a substrate 101 of the TFT-LCD, as shown in FIG. 1.

Hereinafter, a method of fabricating the TFT 100 will be described with reference to FIG. 1

First, a base coat insulating film 102 (thickness: 300 nm) made of $Ta_2O_5$ is formed on one surface of the insulating substrate 101. In this examples a transparent glass plate is used as the insulating substrate 101. Next, a metallic thin film made of tantalum (Ta) is deposited on the base coat insulating film 102 by setting the sputtering power and the speed at which the insulating substrate 101 is transported in a sputtering apparatus so that the thickness of the metallic thin film becomes 300 nm. Thereafter, the metallic thin film is patterned in a predetermined shape by conducting a photolithography process, thereby forming a gate electrode 103. Then, the gate electrode 103 is anodized, thereby forming an anodized film 104.

Nest, the three layers of a $Si_3N_4$ film 105 (thickness: 300 nm), an i-type microcrystalline silicon (µc-Si) film 106 (thickness: 50 nm), and an $Si_3N_4$ film 107 (thickness 200 nm) are successively deposited by an RF-PCVD method.

Figure 2:
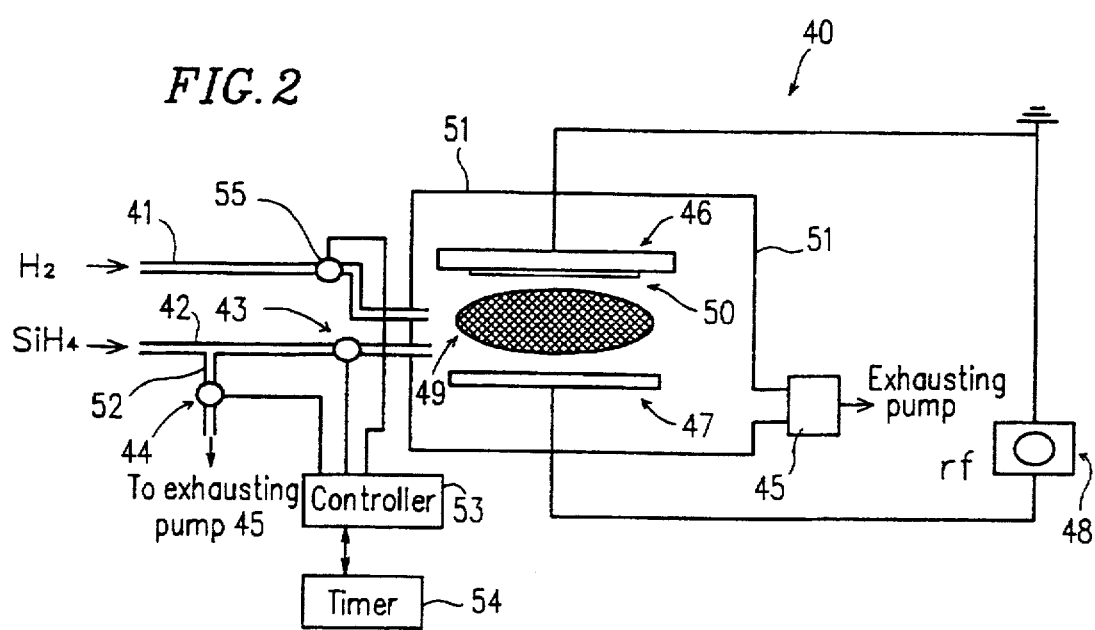
FIG. 2 shows an RF-PCVD apparatus 40 to be used in the example of the present invention.

A process step for forming the i-type µc-Si film 106 will be described in detail below. During this process step, an RF-PCVD apparatus 40 as shown in FIG. 2 is used. This RF-PCVD apparatus is provided with two lines 41 and 42 for introducing hydrogen gas and material gas, respectively, in addition to the respective components of a generally-used RF-PCVD apparatus. The hydrogen gas introducing line 41 and the material gas introducing line 42 are independently communicated with the inside or a reaction chamber 51. A valve 55 for delivering or blocking the hydrogen gas is provided for the hydrogen gas introducing line 41. A valve 43 for delivering or blocking the material gas is provided for the material gas introducing line 42 A branch line 52 is provided for the material gas introducing line 42 at an upstream point of the material gas flow path respect to the valve 43. The branch line 52 is provided with a valve 44. The valve 44 delivers or blocks the material gas through the branch line 52.

A controller 53, e.g., a microcomputer, is connected to the valves 43, 44 and 55 in order to control the delivery operation or the blocking operation of these valves 43, 44 and 55. A timer 54 for counting the time period during which the material gas (to be described later) or only the hydrogen gas is introduced into the reaction chamber 51 is connected to the controller 53. An exhausting pump 45 is connected to the reaction chamber 51 so as to exhaust the gas inside the reaction chamber 51. The exhausting pump 45 can also be connected to the branch line 52.

An anode electrode 46 and a cathode electrode 47 which are connected to an external radio frequency power supply 48 are disposed inside the reaction chamber 51. A substrate 60 is fixed on the side of the anode electrode 46 facing the cathode electrode 47. By applying radio frequency power from the radio frequency power supply 48 to the anode electrode 46 and the cathode electrode 47, plasma 49 is generated between the anode electrode 46 and the cathode electrode 47.

Figure 3A:
FIGS. 3A to 3C are timing charts for illustrating the operation of the RF-PCVD apparatus 40.
Figure 3B:
Figure 3C:
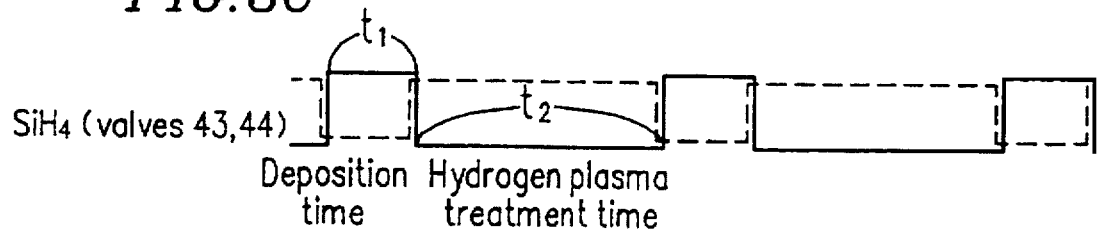

Hereinafter, a Fundamental operation of the deposition apparatus 40 of this example will be described with reference to FIGS. 2 and FIGS. 3A to 3C. FIGS. 3A to 3C are timing charts for illustrating the operation of the deposition apparatus 40.

In this example, as shown in FIG. 3B, the valve 55 for supplying the hydrogen gas is always opened, so that the hydrogen gas is always delivered in FIG. 3C, the solid line indicates the opened/closed states of the valve 43 and the broken line indicates the opened/closed states of the valve 44. As shown in FIG. 3C, when the valve 43 of the material gas introducing line 42 is opened and the valve 44 is closed, the material gas in introduced into the reaction chamber 51. In contrast, when the valve 43 is closed and the valve 44 is opened, the material gas is exhausted directly by the exhausting pump 45 without being introduced into the reaction chamber 51. Accordingly, not only the delivering and the blocking of the material gas but also the exhaustion of the material gas can be controlled even when the valve 43 is closed, thereby suppressing the variation in the pressure inside the reaction chamber 51. Therefore, the controller 53, in connection with the timer 54, controls the opened/closed states of the valves 43 and 44 such that the material gas can be introduced into the reaction chamber 51 during a predetermined period $t_1$ and only the hydrogen gas can be introduced into the reaction chamber 51 during a predetermined period $t_2$, as shown in FIG. 3C.

As shown in FIG. 3A, radio frequency power is applied from the radio frequency power supply 45 to the anode electrode 46 and the cathode electrode 47 in this deposition apparatus 40. In this case, in the period $t_1$ during which the material gas is introduced into the reaction chamber 51, the material gas is decomposed by the plasma 49 so that a silicon film is deposited on the substrate 50. On the other hand, in the period $t_2$ during which only the hydrogen gas is introduced into the reaction chamber 51, the silicon film is being treated with the hydrogen plasma. In the period $t_1$, the silicon film is deposited under the following conditions: flow rate of $SiH_4$ is 130 sccm; flow rate of $H_2$ is 3000 sccm; pressure is 93.1 Pa; and RF power is 100 W.

Figure 4:
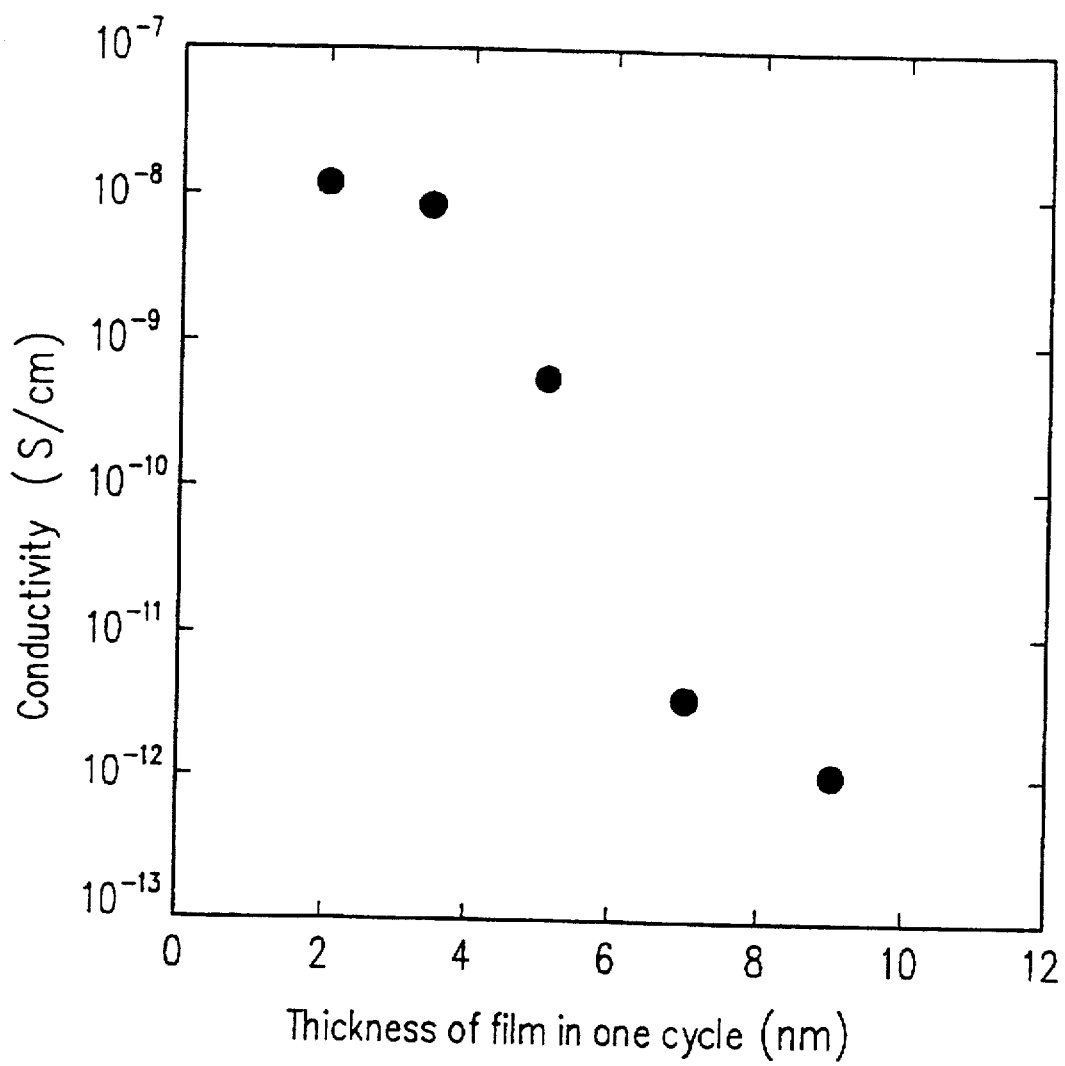
FIG. 4 is a graph showing the relationship between the film thickness in one cycle and the conductivity during a process step for fabricating a TFT of this example.

The thickness of the silicon film deposited during the period $t_1$ considerably affects the characteristics of the silicon film. Hereinafter, the relationship between the thickness and the conductivity of the silicon film will be described. FIG. 4 is a graph showing the relationship between the film thickness in one cycle and the conductivity. In FIG. 4, the hydrogen plasma treatment period $t_2$ is set to be 75 seconds. In a microcrystalline silicon film, the larger the crystalline volume fraction becomes, the larger the conductivity becomes. According to experimental results obtained by the present inventors, if a Si film having a conductivity of $5\times10^{-10}$ S/cm or more is used, then a TFT exhibiting satisfactory characteristics where a large amount of ON current flows can be fabricated. On the other hand, the present inventors have confirmed that if a TFT is fabricated by using a Si film having a conductivity less than $5\times10^{-10}$ S/cm, then the amount of the ON current becomes small and the electric resistance in the contact regions becomes high. Therefore, a Si film having a conductivity of $5\times10^{-10}$ S/cm or more can be regarded as a film of satisfactory quality which is suitable for forming a TFT. As shown in FIG. 4, an appropriate film thickness in one cycle satisfying these conditions is in a range of 0.1 to 5 nm.

Figure 5:
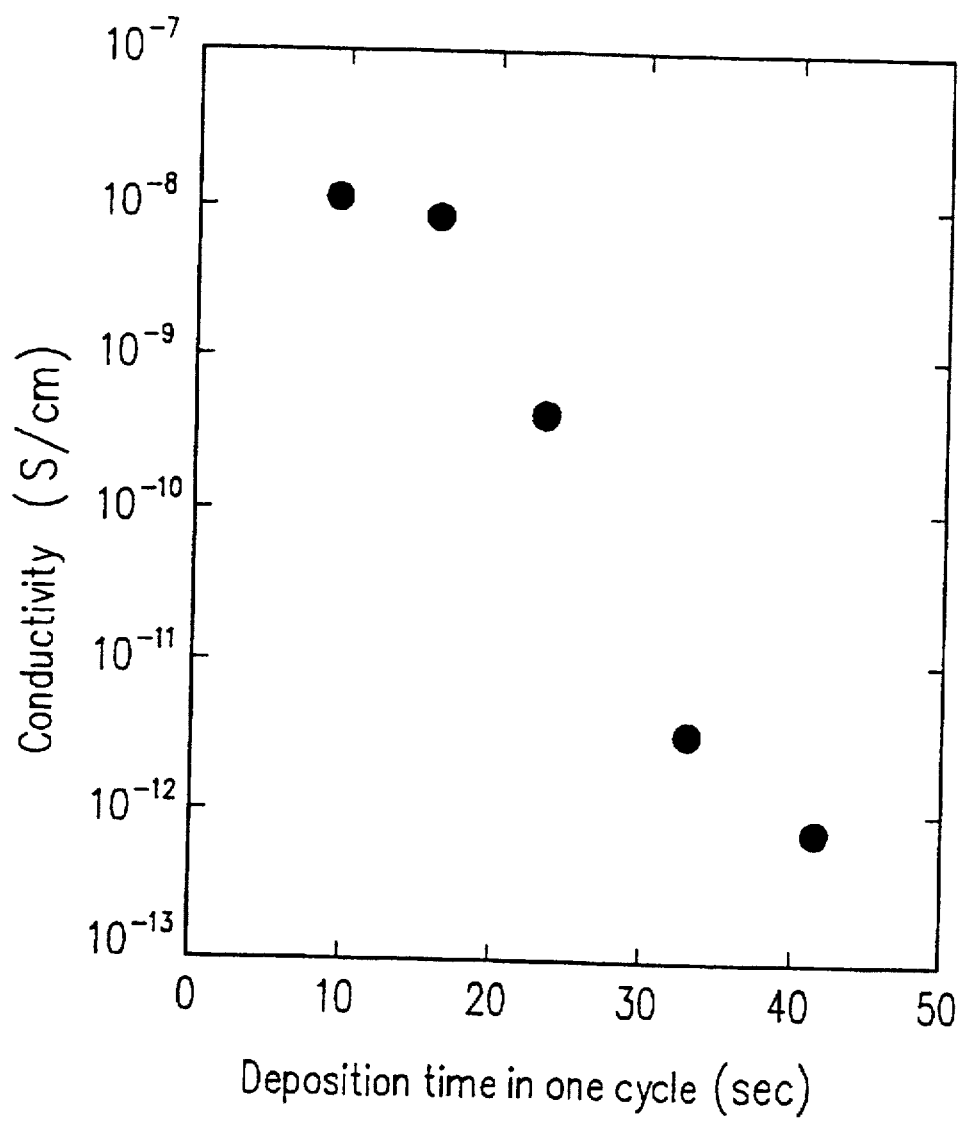
FIG. 5 is a graph showing the relationship between the film deposition period in one cycle and the conductivity during a process step for fabricating a TFT of this example.

If a film with a thickness in a range of 0.1 to 5 nm can be deposited in one cycle, then one to ten layers composed of Si atoms are required to ba grown in one cycle. In actually depositing the Si atom layers to form one to ten layers, it is necessary to appropriately control the deposition period. FIG. 5 is a graph showing the relationship between the film deposition period in one cycle and the conductivity of the Si film. As shown in FIG. 5, if the deposition period in one cycle is set to be 23 seconds or less, then the conductivity of the resulting Si film can be $5\times10^{-10}$ S/cm or more.

By repeating this deposition of a Si film and the hydrogen plasma treatment for the deposited Si film, it is possible to obtain a μc-Si film with a desired thickness.

For example, a suitable μc-Si film can be deposited under the following conditions. Monosilane $(SiH_4)$ is used as a material gas and the flow rate thereof is set to be in an approximate range of 100 to 200 sccm; the low rate of hydrogen $(H_2)$ is set to be in an approximate range of 2000 to 4000 sccm; the period $t_1$ is set to be 10 to 30 seconds; and the period $t_2$ is set to be 20 to 130 seconds.

Under these conditions, a non single crystal silicon film having a thickness of 0.1 to 5 nm can be grown in one cycle, and this film can be subjected to a hydrogen plasma treatment. In this example, by repeating the deposition and the hydrogen plasma treatment 10 to 500 times, a μc-Si film having a thickness of 50 nm is finally obtained.

Figure 6:
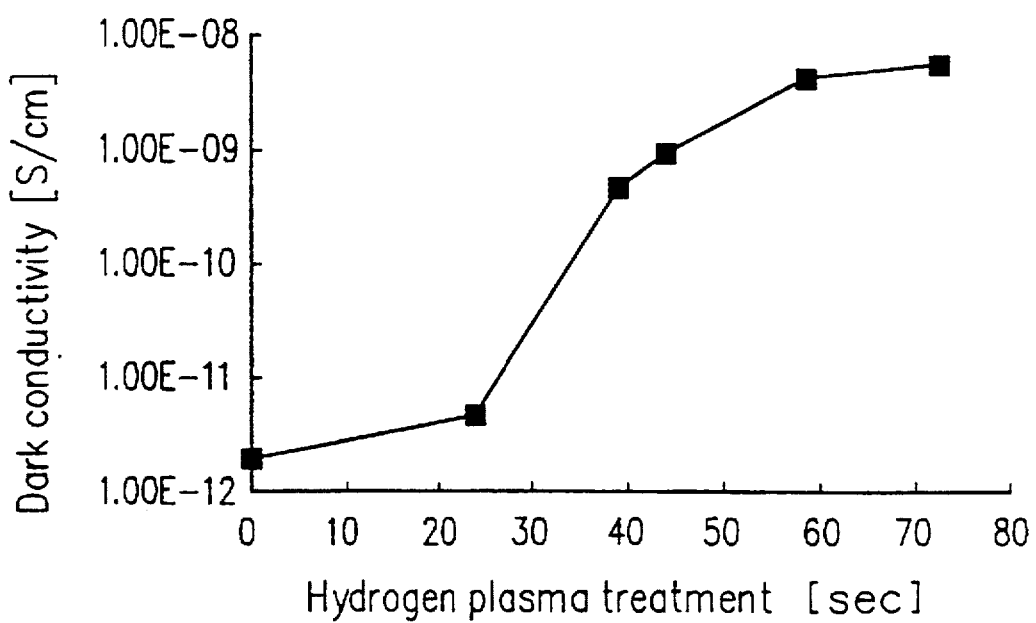
FIG. 6 is a graph showing the relationship between the hydrogen plasma treatment period and the dark conductivity of i-type Si film during a process step for fabricating a TFT of this example.

FIG. 6 is a graph showing the relationship between the time period during which the hydrogen plasma treatment is performed in the intervals between the deposition processes and the dark conductivity of the i-type Si film formed in the above-described manner. The Si film is deposited under the following conditions: the flow rate of $SiH_4$ is 130 sccm, the flow rate of H, is 3000 sccm; the pressure is 93.1 Pa; the RF power is 100 W; and thickness of the file deposited in one cycle is 2 nm. As shown in FIG. 6, the dark conductivity of the i-type Si film is drastically increased by about three orders by performing the hydrogen plasma treatment for about 40 seconds, so that the dark conductivity of the Si film becomes $5\times10^{-10}$ S/cm or more.

In this example, the silicon film comes to have a microcrystalline structure by performing the hydrogen plasma treatment, as described above. This fact shows that the hydrogen plasma treatment changes the crystalline structure of a super-thin film having a thickness of 50 nm or less. In order to change the crystalline structure by performing the hydrogen plasma treatment, a film having a thickness in an approximate range of 0.1 to 5 nm, and more preferably in an approximate range of 0.5 to 3 nm, is suitably used. If the film thickness is set to be such a value, then it is necessary to perform a combination or the deposition process and the hydrogen plasma treatment 20 to 1000 times.

On the other hand, even when the film is continuously deposited without performing the hydrogen plasma treatment, a microcrystalline silicon film can be obtained under the conditions where a hydrogen dilution ratio is high and a high power is supplied. The hydrogen dilution ratio is herein defined by the ratio of hydrogen ($H_2$) to monosilane ($SiH_4$). When the silicon film is deposited under the conditions where the hydrogen dilution ratio is 30 and a power of 250 W is supplied, a microcrystalline silicon film having a conductivity of $5 \times 10^{-10}$ S/cm can be obtained. In this case, the deposition rate of the film is 0.03 nm/sec. On the other hand, when the silicon film is deposited under the conditions where the hydrogen dilution ratio is 30 and a power of 100 W is supplied, a microcrystalline silicon film having a conductivity of $1 \times 10^{-9}$ S/cm can be obtained. In this case, the deposition rate of the film can be increased from 0.03 nm/sec to 0.1 nm/sec. Furthermore, when the silicon film is deposited under the conditions where the hydrogen dilution ratio is 100 and a power of 100 W is supplied, a microcrystalline silicon film having a conductivity of $3 \times 10^{-8}$ S/cm can be obtained. In this case, the deposition rate of the film is 0.04 nm/sec.

As is apparent from the above results, when the hydrogen dilution ratio is 30 or more, a microcrystalline silicon film having a conductivity of $5 \times 10^{-10}$ S/cm or greater can be obtained. In the case where the silicon film is doped by ion implanting, a microcrystalline silicon film having a conductivity of $3 \times 10^0$ S/cm or greater can be obtained.

In forming the µc-Si film, if a nucleus for crystal growth is prepared by setting the hydrogen dilution ratio to be 200 or more until the film is deposited to be 10 nm thick, then the Si atoms are gathered to the nucleus for crystal growth so as to form a microcrystalline structure even when the film is subsequently deposited at the hydrogen dilution ratio of 2 to 200. As a result, a µc-Si film having an even larger crystalline volume fraction can be obtained.

The amount of hydrogen bound in the µc-Si film formed by repeating the above cycle is quantified to be 8–10 atomic percent by an infrared absorption spectrum method, while the amount of hydrogen bound in a usual a-Si film is 13–20 atomic percent. This is because the amount of hydrogen bound in crystalline Si which is included in the µc-Si film together with a-Si is substantially 0 atomic percent.

The composition of the µc-Si film thus formed was analyzed by the present inventors by a Radian spectroscopy and a reflected high-energy electron diffraction. The film was confirmed to be a silicon film, including the microcrystalline structure. In addition, the Raman scattering spectrum of the µc-Si film was divided into a broad peak specific to a-Si at about 480 $cm^{-1}$, and a sharp peak of crystalline Si, i.e., a peak of the Si-Si binding at 520 $cm^{-1}$. Based on the integrated intensity ratio of these peaks, the crystalline volume fraction representing the crystalline Si percentage of the µc-Si film was measured.

The following results were obtained.

(1) The crystalline volume fraction was 0% in the a-Si film formed by generally used CVD method under the usual conditions for depositing an a-Si film, and in the silicon film formed so as to have a thickness of 50 nm or less by the P-CVD method without performing a hydrogen plasma treatment.

(2) In the µc-Si film formed under the conditions where a high RF power was supplied and the hydrogen dilution ratio was set to be 30 or less, the crystalline volume fraction was 10% or less.

(3) In the µc-Si film formed under the conditions where a high RF power was supplied and the hydrogen dilution ratio was set to be 30 or more, the crystalline volume fraction was in a range of 10 to 50%.

(4) As for the µc-Si film obtained by repeating the process in which the silicon film was deposited by decomposing the material gas containing silicon element with the plasma and the process in which the deposited silicon film was treated with hydrogen plasma by introducing the hydrogen gas into the reaction chamber so as to form the microcrystalline structure in the silicon film, the crystalline volume fraction was in a range of 8 to 60% as shown in Table 1 below The maximum crystalline volume fraction of the µc-Si film thus obtained was 70%.

In addition, the results of the analysis for the Si films deposited under another conditions are shown in Table 2.

TABLE 1

| Deposition deposition time [sec] | Conditions hydrogen treating time [sec] | Conductivity Before doping [S/cm] | Conductivity After doping [S/cm] | Amount of bound hydrogen [%] | Crystalline volume fraction [%] |
|---|---|---|---|---|---|
| 20 | 75 | 1E-8 | 2.5E0 | 8 | 60 |
| 20 | 50 | 5E-10 | 3.0E0 | 10 | 10 |
| 20 | 30 | 4E-12 | 1.37E-4 | 11 | 8 |
| 40 (For reference) | 75 | 1E-12 | 1.30E-4 | 12 | 8 |
| a-Si (n⁺) deposited byP-CVD | | 1E-3 | | 15 | 0 |
| µc-Si (n⁺) deposited byP-CVD | | 1E0 | | 10 | 8 |

TABLE 2

| Deposition deposition time \|sec\| | Conditions hydrogen treating time \|sec\| | Thickness in 1 cycle \|nm\| | Conductivity \|S/cm\| | Amount of bound hydrogen \|%\| | Crystalline volume fraction \|%\| |
|---|---|---|---|---|---|
| 9.5 | 25 | 2.5 | 6.0E-12 | 13 | 8 |
| 9.5 | 40 | 2.3 | 5.0E-10 | 10 | 10 |
| 9.5 | 45 | 2.2 | 1.0E-9 | 9 | 30 |
| 9.5 | 60 | 2.1 | 9.5E-9 | 8 | 65 |
| 9.5 | 75 | 2.0 | 1.5E-8 | 7 | 70 |
| 40 | 75 | 5.7 | 1.0E-12 | 13 | 8 |

Figure 11:
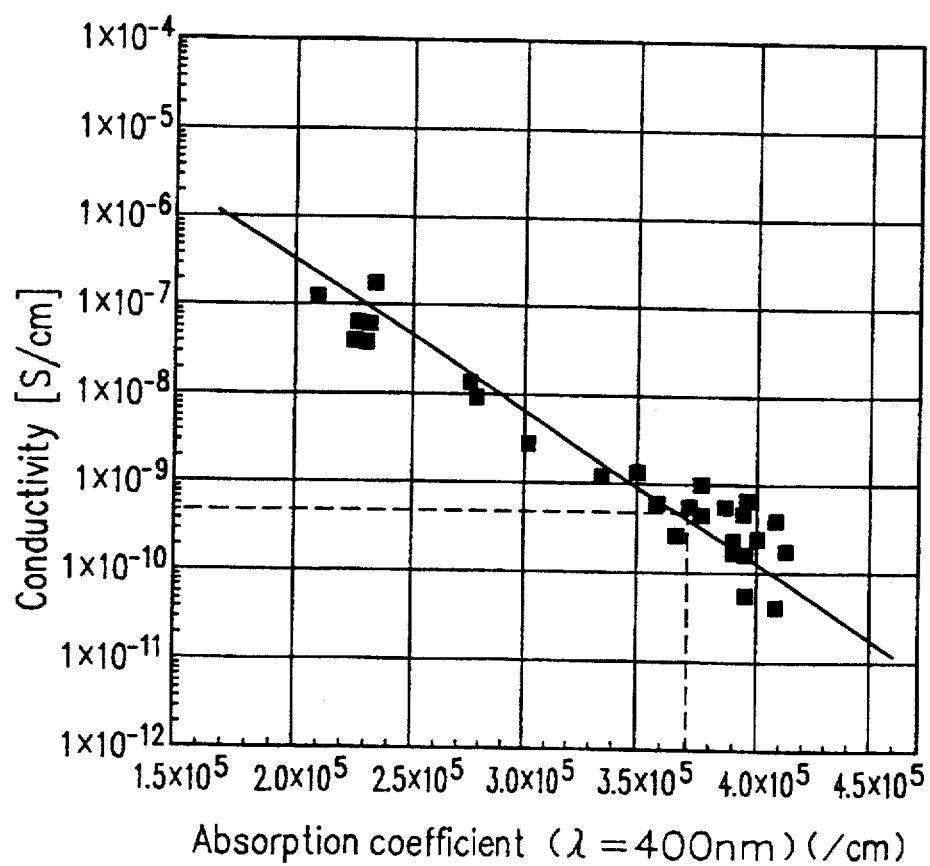
FIG. 11 is a graph showing the relationship between the absorption coefficient for light with a wavelength of 400 nm and the conductivity of the µc-Si film deposited by changing the film thickness in one cycle.

FIG. 11 is a graph showing the relationship between the absorption coefficient and the conductivity of the μc-Si film deposited by changing the thickness of the film deposited in one cycle shown in FIG. 4. In the μc-Si film where the conductivity is $5 \times 10^{-10}$ S/cm or more, the number of the crystal grains having a small absorption coefficient is increased, so that the absorption coefficient of such a film becomes lower as compared with the other films. As a result, the absorption coefficient of the film with respect to the light having a wavelength of 400 nm is $3.7 \times 10^5$/cm or less. The value of the wavelength is selected as a wavelength where the correlation between the absorption coefficient and the conductivity is most satisfactory. The reason is as follows. If a wavelength is set to be less than 400 nm, then the information around the optical band gap can be obtained. However, the variation in the absorption coefficient becomes large and the correlation between the absorption coefficient and the conductivity becomes less satisfactory.

The microcrystalline component of the μc-Si film having a conductivity of $5 \times 10^{-10}$ S/cm or more are measured with a transmission type electron microscope by a micro diffraction method As a result, the number of the crystal grains of which {111} axes are perpendicular to the substrate is the largest.

An i-type μc-Si film of satisfactory quality can be obtained by performing the method for fabricating the TFT of this example.

Hereinafter, referring to FIG. 1 again, a method for fabricating a TFT 100 having a reversed stagger structure will be further described. After successively depositing the three layers of an $Si_3N_4$ film 105 (thickness: 300 nm), an i-type microcrystalline silicon (μc-Si) film 106 (thickness: 50 nm), and an $Si_3N_4$ film (thickness: 200 nm) by an RF-PCVD method, the $Si_3N_4$ film is patterned in a predetermined shape by photolithography. More specifically, a photoresist layer is formed on the $Si_3N_4$ film, and thereafter the photoresist layer is exposed to light from the reverse side of the transparent insulating substrate 101, i.e., the side on which the TFT 100 is not formed, by using as a mask the gate electrode 103 formed of Ta. Then, the $Si_3N_4$ film is etched. In this manner, the channel protection film 107 is formed.

Figure 7:
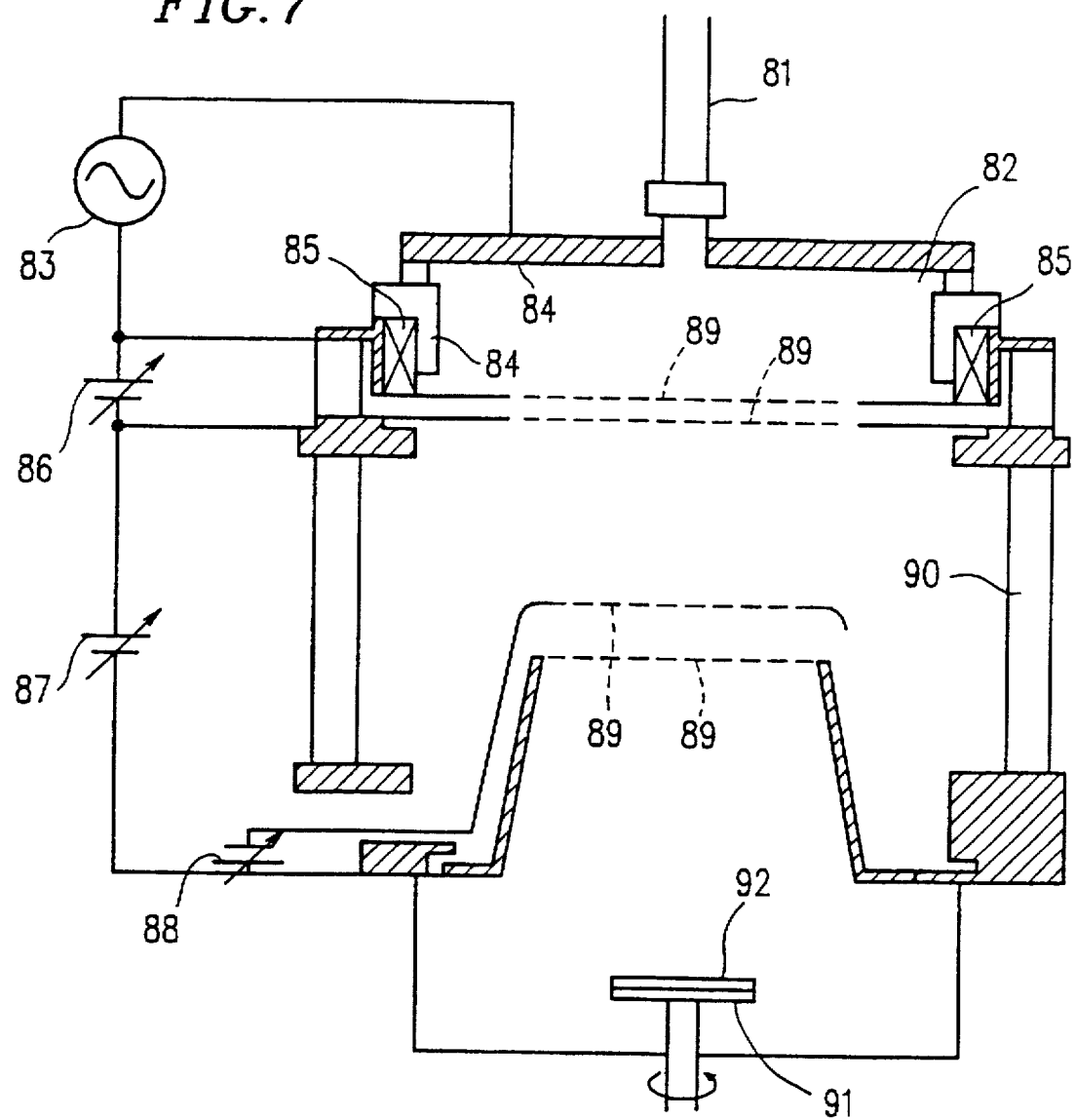
FIG. 7 shows an ion doping apparatus to be used in this example.

FIG. 7 is a cross-sectional view schematically showing an ion doping apparatus to be used for forming an $n^-$-type μc-Si film 108. The ion doping apparatus of this example includes a gas inlet port 81 in communication with a chamber 82. The chamber 82 constitutes a plasma chamber for generating a plasma (i.e., an ion source). A radio frequency power supply 83 for exciting the plasma is provided outside of the chamber 82. A radio frequency electrode 84 for supplying a radio frequency power to the plasma and a magnet 85 for increasing the ionization rate and adjusting the shape of the plasma are provided inside the chamber 82, thereby forming the plasma.

A first stage ion accelerating power supply 86 for bringing the ions from the plasma and a second stage ion accelerating power supply 87 for further accelerating the ions brought out from the plasma are connected in series to the radio frequency power supply 83. A decelerating power supply 88 for controlling second-order electrons is further connected in series to the second stage ion accelerating power supply 87, and to mesh-shaped electrode plates 89 provided inside the chamber 82. An insulator 90 for electrically insulating the mesh-shaped electrode plates 89 connected to the radio frequency electrode 84, the first and the second stage ion accelerating power supplies 86 and 87, and the decelerating power supply 88 is provided, thereby forming an ion acceleration portion. A substrate holder 91 on which the substrate 92 is fixed is provided inside the chamber 82. The holder 91 is driven to rotate around the rotation axis disposed along the vertical direction.

Hereinafter, referring to FIG. 7, the operation of the ion doping apparatus of this example will be described. First, a material gas such as monosilane ($SiH_4$) gas diluted with hydrogen is introduced through the gas inlet port 81 into the chamber 82. Then, the radio frequency power is supplied from the radio frequency power supply 83 to the radio frequency electrode 84. As a result, the excited plasma is formed, and the ions brought but from the plasma are accelerated between the accelerating electrode plates 89, thereby doping the substrate 92 mounted on the substrate holder 91 with the ions.

By using such an ion doping apparatus, it is possible to dope a large-scale substrate with ions without mechanically scanning a sample substrate or electrically scanning the ion beams. More specifically, the i-type μc-Si film 106 is doped with impurity ions by using the above-described ion doping apparatus and the channel protection film 107 as a mask, under the conditions where the acceleration voltage is 30 keV, the implant dose it $5 \times 10^{15}$/cm$^2$, and the slow rate of the material gas is 20 sccm ($PH_4/H_2$=5.0). As a result, a pair of doped regions 108 are formed so as to sandwich a region 106 not doped with the ions, as shown in FIG. 1. Thereafter, the doped regions 108 are annealed at 250° C. for an hour, and then are patterned so that the respective doped regions 108 are in the predetermined shapes, thereby forming the source region and the drain region.

The relationship among the deposition conditions including the time required for actually depositing the microcrystalline silicon film, the time during which the hydrogen plasma treatment is performed, and the measured conductivities of the resultant film before and after the doping of the ions is also shown in Table 1. The results shown in Table 1 will be analyzed in detail below.

(1) In the case of depositing a μc-Si film so as to be 50 nm thick by repeating the deposition of a silicon layer (the time period in one cycle: 20 seconds) and the hydrogen plasma treatment (the time period in one cycle: 75 seconds) under the conditions where the flow rate of $SiH_4$ is 130 sccm, the flow rate of $H_2$ is 3000 sccm, and the RF power is 150 W, the conductivity of the μc-Si film before doping the ions is $1\times10^{-6}$ S/cm, while the conductivity of the μc-Si film after doping the ion is $2.5\times10^0$ S/cm. The latter conductivity is substantially equal to that of the n-type microcrystalline silicon film deposited by the P-CVD method.

(2) In the case of depositing a μc-Si film so as to be 50 nm thick by repeating the deposition of a silicon layer (the time period in one cycle: 20 seconds) and the hydrogen plasma treatment (the time period in one cycle: 50 seconds), the conductivity of the μc-Si film before doping the ions is $5\times10^{-10}$ S/cm while the conductivity of the μc-Si film after doping the ions is $3.0\times10^0$ S/cm.

(3) in the case of depositing a μc-Si film so as to be 50 nm thick by repeating the deposition of a silicon layer (the time period in one cycle: 20 seconds) and the hydrogen plasma treatment (the time period in one cycle: 30 seconds), the conductivity of the μc-Si film before doping the ions is $4\times10^{-10}$ S/cm, while the conductivity of the μc-Si film after doping the ions is $1.37\times10^{-4}$ S/cm. That is to say, the conductivity of the film alter doping the ions can not be reduced to less than that of the n-type a-Si.

(4) In the case of depositing a μc-Si film so as to be 50 nm thick by repeating the deposition of a silicon layer (the time period in one cycle: 40 seconds) and the hydrogen plasma treatment (the time period in one cycle: 75 seconds), the conductivity of the μc-Si film before doping the ions is $1.00\times10^{-12}$ S/cm, while the conductivity of the μc-Si film after doping the ions is $1.30\times10^{-4}$ S/cm.

According to the experiment performed by the present inventors, in the case of continuously depositing a μc-Si film so as to be 50 nm thick without performing the hydrogen plasma treatment under the conditions where the hydrogen dilution ratio is high and a high power is supplied: the flow rate of $SiH_4$ is 60 sccm, the flow rate of $H_2$ is 3000 sccm, and the RF power is 200 W, the conductivity of the μc-Si film before doping the ions is $1\times10^{-9}$ S/cm, while the conductivity of the μc-Si film after doping the ions is $1.47\times10^0$ S/cm.

As is apparent from the above, in the case or using a silicon film having the conductivity of $5\times10^{-10}$ S/cm or more before doping the ions, the conductivity can be considerably reduced by doping the silicon film with ions. However, in an i-type μc-Si film in which the conductivity before doping the ions is low, the conductivity of the film can not be reduced to less than that of the n-type a-Si film.

A Ti film (thickness: 300 nm) is deposited on the respective doped regions 108 formed under the conditions where the conductivity is considerably reduced, as shown in FIG. 1. Then, the Ti film is patterned in a predetermined shape by photolithography, thereby forming the electrode layers 109 to be used as a source electrode and a drain electrode. Next, a transparent conductive film such as an indium tin oxide (ITO) film is deposited by sputtering to be 100 nm thick. Then, the transparent conductive film is patterned in a predetermined shape by a photolithography process, thereby forming a pixel electrode 110.

A TFT matrix substrate usable for the TFT-LCD of this first example is completed in the above-described manner.

In the fabrication method of this example, a channel protection film 107 is formed and the intrinsic semiconductor layer 106 is doped with impurity ions by using the channel protection film 107 as a mask. Alternatively, the intrinsic semiconductor layer 106 can be doped with impurity ions by using as a mask a photoresist having the same shape as that of the channel protection film 107 which is formed on the channel protection film 107 or is formed in place of the film 10. In such a case, it is also possible to realize a TFT exhibiting as excellent characteristics as those or the TFT described above.

Figure 8:
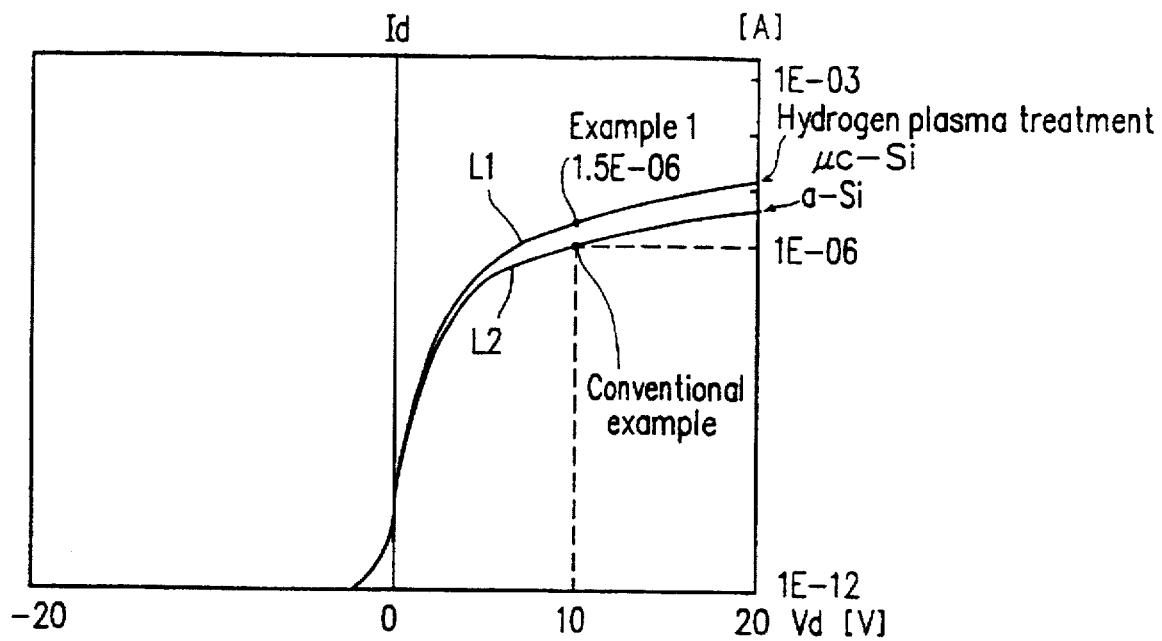
FIG. 8 is a graph showing the variation in the ON current of a TFT according to the example of the present invention and a conventional TFT.

FIG. 8 shows the measurement results of the characteristics of the TFT fabricated in accordance with the method of this first example. More specifically FIG. 8 is a graph showing the relationship between a drain voltage and a drain current when the TFT is operated. In FIG. 8, the curve L1 indicates the characteristics of the TFT of this example, while the curve L2 indicates the characteristics of a conventional TFT using an a-Si film. As shown in FIG. 8, when the drain voltage is 10 V, the value of the drain current of the TFT of this example is $1.5\times10^{-6}$ A, while the value of the drain current of the conventional TFT is $1.0\times10^{-6}$ A. Thus, in the TFT of this example, it is possible to obtain an ON current 1.5 times at large as that of the TFT in which an a-Si film is used as a semiconductor layer.

In addition, the present invention obtained the following experiment result: in the case of treating the upper surface of the gate insulating film 105 with the hydrogen plasma for three minutes before forming the semiconductor film 106 on the gate insulating film 105, the possibility of the generation of some undesired current variation or a rugged shape in the low-voltage region of the Vd-Id characteristics of the resulting TFT is reduced, so that a satisfactory contact can be formed. According to the method of this example, it is possible to realize a TFT where the resistance of the respective doped regions 108 to be used as the source region and the drain region are considerably reduced. In addition, the respective doped regions 108 of such a TFT are formed by using the channel protection film 107 as a mask, so that the channel length can be shortened with high precision. Moreover, in fabricating such a TFT, it is no longer necessary to separately form a low-resistance thin film such as a conventional low-resistance silicide film mentioned above. As a result, the number of necessary process steps can be remarkably reduced.

Next, a modified example of Example 1 will be described In this modified example, a semiconductor film is formed by performing continuous deposition, unlike in Example 1.

A method for forming a silicon film having a microcrystalline structure by continuously depositing respective layers will be described with reference to FIG. 2. First, a material gas containing $SiH_4$ and a hydrogen gas are introduced into a reaction chamber 51 of an RF-PCVD apparatus 40, thereby forming a silicon layer which is about 10 nm thick under the conditions where the hydrogen dilution ratio ($H_2/SiH_4$ ratio) is 200 or more and the power is in approximate range of 100 to 500 W (the power density is in an approximate range of 0.01 to 0.05 $W/cm^2$), and more preferably in an approximate range of 150 to 300 W. Thereafter, by varying the flow rate of hydrogen gas so that the hydrogen dilution ratio becomes 2 to 200, another silicon layer (or a second silicon layer) is formed on the silicon layer previously formed (or a first silicon layer) at the power of 150 to 300 W.

Following are the specific deposition conditions used in the fabrication method of this modified examples. The first silicon layer is formed so as to be 10 nm thick under the conditions where the flow rate of $SiH_4$ is 10 sccm; the flow rate of $H_2$ is 2000 sccm; the power is 200 W; the substrate temperature is 300° C.; and the pressure is 100 Pa. Then, by changing the flow rate of $SiH_4$ to 20 sccm, the second silicon layer is formed on the first silicon layer so that resulting silicon film is 50 nm thick.

The silicon film this formed is analyzed by an infrared absorption spectral method, a reflective high-energy electron diffraction method, a Raman spectroscopy or the like. The result of the analysis confirms that the silicon film is a μc-Si film. The amount of hydrogen bound in the μc-Si film is 8 atomic percent, and the crystalline volume fraction is 30% or more. Moreover the dark conductivity of the i-type μc-Si film is measured to be $2 \times 10^{-6}$ S/cm or more. This means the silicon film thus formed has excellent dark conductivity.

In this example, the silicon layer is first deposited by initially setting the hydrogen dilution ratio to be very high, e.g., 200 or more. Therefore, the deposition rate becomes very low, e.g., 0.005 nm/sec or less. However, a microcrystalline silicon film can be obtained by performing the processes as described in this modified example even when the thickness of the resulting film is about 10 nm or less. In this modified example, since the μc-Si layer is first deposited up to the thickness of about 10 nm from the beginning of the deposition with very high hydrogen dilution ratio, a successively formed silicon layer also has the microcrystalline structure by being influenced by the previously deposited μc-Si layer. When the μc-Si film with a thickness of 10 nm is deposited from the beginning or the deposition, the hydrogen dilution ratio is changed to between 2 and 200. As a result, the deposition rate can be increase from the initial deposition rate up to 0.02 to 0.03 nm/sec. Consequently, it is possible to form a silicon film with a desired thickness having the microcrystalline structure on the silicon film with a thickness of 10 nm or less serving as a nucleus.

In the foregoing examples, the present invention has been described as being applied to a TFT having a reversed stagger structure. Needless to say, the crystallinity of a film can be improved as the thickness of the film becomes large. Therefore, by applying the present invention to a TFT having a stagger structure or a coplanar structure, the characteristics of the TFT can be further improved.

EXAMPLE 2

Figure 9:
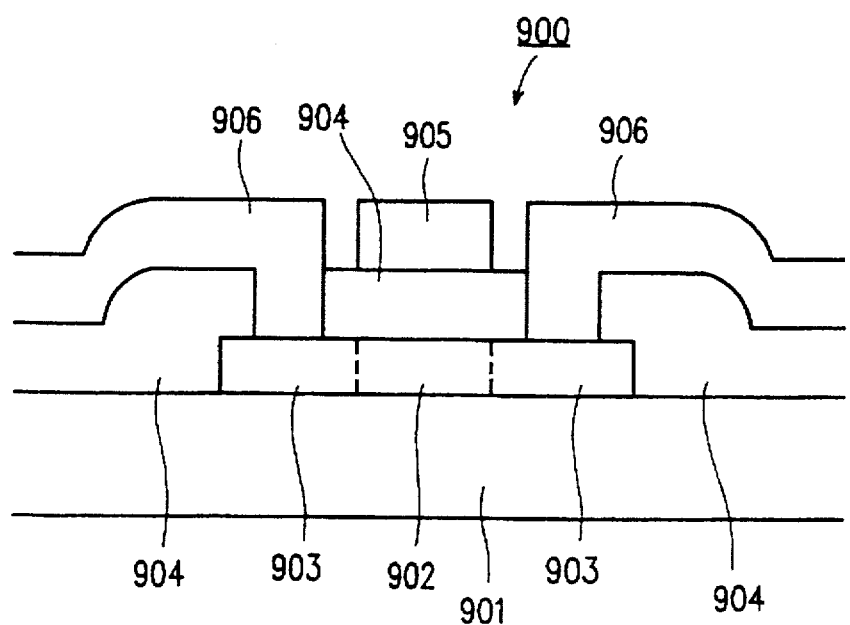
FIG. 9 is a cross-sectional view of a TFT having a coplanar structure according to another example of the present intention.

FIG. 9 is a cross-sectional view showing a TFT 900 having a coplanar structure The TFT 900 includes an intrinsic microcrystalline silicon (i-type μc-Si) region 902 formed on an insulating substrate 901 by a method described in Example 1 or the modified example of Example 1, and a pair of doped regions (n+-type microcrystalline silicon regions) 903 sandwiching the region 902 therebetween. The doped regions 903 serve as a source region and a drain region, respectively. On the entire surface of the insulating substrate 901, an insulating film 904 is formed to cover the i-type μc-Si region 902. The insulating film 904 has a pair of contact holes formed in positions such that the contact holes correspond to the doped regions, respectively. Through these contact holes, a conductive layer 906 serving as a source electrode and a drain electrode, which is formed on the insulating film 904, are connected to the source region and the drain region, respectively.

Figure 10:
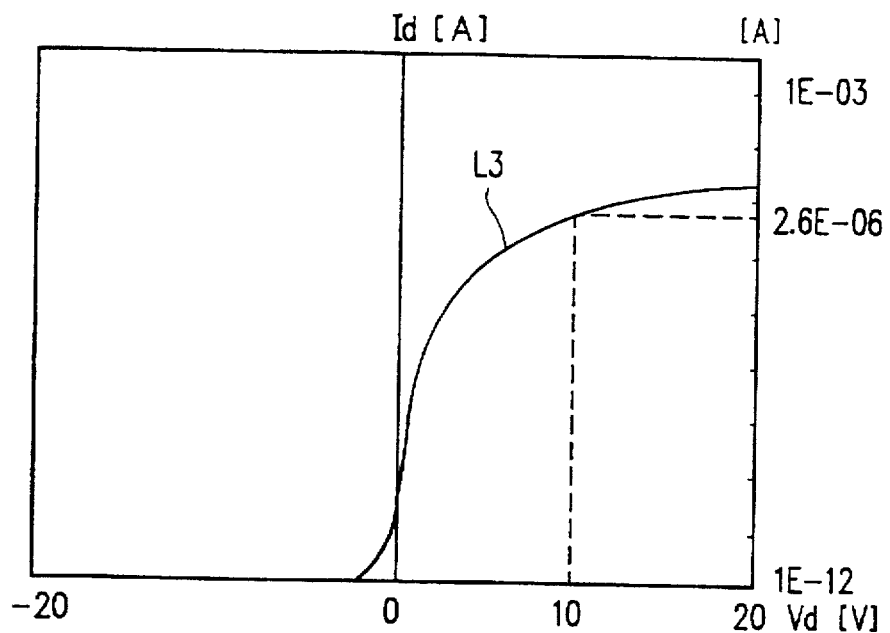
FIG. 10 is a graph showing the variation in the ON current of a TFT according to the example of the present invention.

FIG. 10 shows the measurement results of the characteristics of the TFT 900 having such a coplanar structure. More specifically, FIG. 10 is a graph showing the relationship between a drain voltage and a drain current when the TFT 300 is operated. In FIG. 10, the curve L3 indicates the characteristics of the TFT 900 of this example As shown in FIG. 10, when the drain voltage is 10 V, the drain current value of the TFT of this example is $2.6 \times 10^{-6}$ A. Thus, in the TFT 900 of this example, it is possible to obtain an ON current 2.6 times as large as that of the conventional TFT as is apparent from the comparison between the curve L3 and the curve L2 indicating the characteristics to the conventional TFT in FIG. 8.

Consequently, the TFT of the second example having such a structure allows for attaining the same effects as those described in the first example.

In the foregoing examples, a semiconductor device of the present invention has been described as being applied only to a TFT. However, the sheet resistance of the n+-type semiconductor layer formed by doping the microcrystalline silicon layer of the invention with the impurity ions is lower than that of a conventional silicon layer formed by doping an amorphous silicon layer with the impurity ions. In addition, the present inventors have found that the activating energy obtained based on the resistance-temperature characteristics of the n+-type semiconductor layer of this example is about 0.05 eV. Since this activating energy is lower than that of a conventional doped layer formed by doping the a-Si film with the ions, e.g., 0–20 eV, it is obvious that the semiconductor characteristics of the n+-type semiconductor layer are satisfactory. Therefore, a thin-film semiconductor device according to the present invention, including the TFT described in the foregoing examples, realizes the characteristics which are better then the characteristics of a conventional thin-film semiconductor device. The present invention is applicable not only to the thin-film transistor described above, but also s thin-film diode, a thin-film solar cell, a thin-film photodiode, a thin-film photodiode array, a driver using a thin-film transistor, and the like.

According to the present invention, by doping a silicon film having a microcrystalline structure of satisfactory quality (e.g., the conductivity of which is high) with impurity ions, it is possible to realize the reduction in the resistance of the silicon film as compared with an n-type semiconductor layer formed by doping a conventional amorphous silicon semiconductor film with impurity ions, thereby forming an n-type semiconductor layer, a contact layer and a contact of higher quality than conventional ones. In addition, since a completely self-aligned thin-film semiconductor device can be fabricated, it is possible to reduce the parasitic capacitance in the semiconductor device and downsize the semiconductor device. Furthermore, since the resistance can be reduced as described above, it is no longer necessary to separately form a thin film having a low resistance, thereby considerably reducing the number of necessary process steps.

EXAMPLE 3

Figure 12:
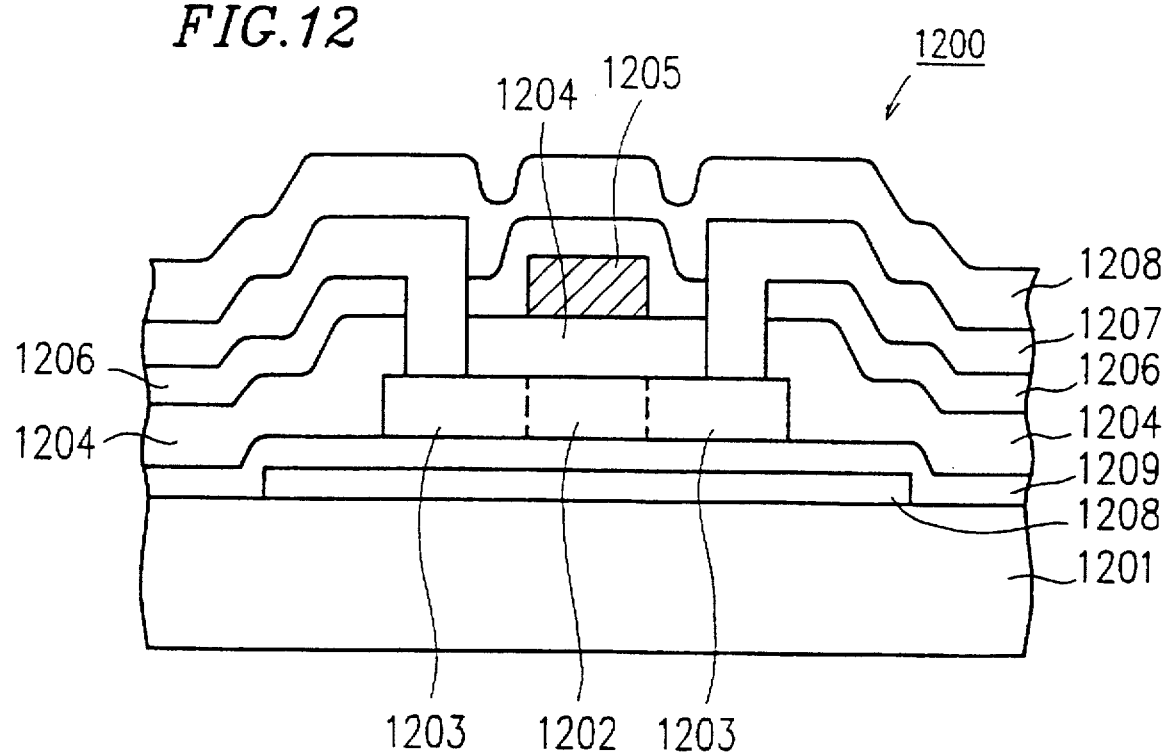
FIG. 12 is a cross-sectional view showing a TFT having a coplanar structure according to an example of the present invention.

FIG. 12 is a cross-sectional view showing a TFT 1200 having a coplanar structure which is different from the structure of TFT 900 shown in FIG. 9. The TFT 1200 includes: an intrinsic microcrystalline silicon (i-type μc-Si region 1202, a pair of doped regions (n+-type μc-Si regions) 1203 sandwiching the i-type μc-Si region 1202; a gate electrode 1205; a gate insulating film 1204 for insulating the gate electrode 1207 from the i-type μc-Si region 1202; a conductive layer 1207 including a source electrode and a drain electrode which are electrically connected to doped regions 1203, respectively.

The TFT 1200 is formed on an insulating substrate 1201. In this example, a transparent glass substrate is used as the insulating substrate 1201. After a light shielding film 1209 and a base coat insulating film 1210 are formed in this order on the substrate 1201, the TFT 1200 is formed on the substrate 1201. On the base coat insulating film 1210, a semiconductor layer including regions 1202 and 1203 is formed. The gate insulating film 1204 formed on the semiconductor layer has a pair of contact holes. The contact hoops are positioned to correspond to the doped regions 1203, respectively. On the gate insulating film 1204, the gate electrode 1205 is formed to be positioned above the i-type μc-Si region 1202. An interlevel insulating film 1206 is formed to cover the gate electrode 1205 The source electrode and the drain electrode are formed to be respectively connected to the doped regions 1203 through the contact holes formed in the insulating films 1204 and 1206. After the TFT 1200 is completed, a passivation film 1208 is formed on the entire surface of the substrate 1201.

Next, a method for fabricating the TFT 1200 as shown in FIG. 12 will be described in detail below.

First, a metallic layer, such as a chrome layer, is deposited to have a thickness of 100 to 500 nm by sputtering. By patterning the chrome layer, the light shielding film 1208 is formed Then, a SiO$_2$ layer, which is used as the base coat insulating film 1209, is deposited to have a thickness of 50 to 500 nm by sputtering.

Next, an i-type μc-Si film is formed to be 50 nm thick in the RF-PCVD deposition apparatus 40 as shown in FIG. 2 This deposition of the i-type μc-Si film is performed as in Example 1. Alternatively, the i-type μc-Si film may be formed by successively depositing silicon layers under the conditions where the hydrogen dilution ratio is high and a high RF power is supplied. In this case, however, the deposition rate becomes low, e.g., about 0.01 nm/s. In particular, in order to obtain a microcrystalline structure within a region of 50 nm or less, the hydrogen dilution ratio is required to be 200 or more, and the deposition rate becomes 0.005 nm/sec or less. On the other hand, by performing the hydrogen plasma treatment, it is possible to obtain a microcrystalline structure within a region of 50 nm or less.

After the deposited μc-Si film is patterned in a predetermined shape, the SiO$_2$ film having a thickness in an approximate range of 100 to 500 nm functioning as a gate insulating film 1204 is formed by sputtering or the like. Next, a metallic film such as an Al film or the like is deposited by sputtering and then patterned to form a gate electrode 1205. Subsequently, self-aligned doped regions 1203, i.e, n$^-$-type μc-Si regions are formed by doping the ion using the gate electrode 1206 as a mask. Thereafter, a SiO$_2$ film having a thickness in an approximate range of 300 to 500 nm to be used as an interlevel insulating film 1206 is formed by sputtering. Next, the contact holes are provided through both the gate insulating film 1204 and the interlevel insulating film 1206. Then, a metallic film such as an aluminum film having a thickness in an approximate range of 200 to 500 nm to be used as the source and the drain electrodes 1207 is deposited by sputtering and even patterned. In order to improve the reliability of the TFT, the passivation film 1208 having a thickness in an approximate range of 200 to 500 nm is deposited thereon. The characteristics of the TFT thus formed are measured. As a result, it is possible to obtain an ON current 2.6 times as large as the ON current obtained in the case of using an a-Si film as a semiconductor layer as shown in FIG. 8.

In addition, if the hydrogen plasma treatment is performed before depositing the Si film for one to ten minutes under the conditions where the flow rate of H$_2$ is 2000 to 4000 sccm; the pressure is 50 to 200 Pa; and the RF power is about 200 W, then the dangling bonds in the film underlying the silicon film are reduced; a nucleus for a micro crystal is more likely to be formed; and the amount of the ON current flowing through the TFT can be increased by about 1.2 times as compared with the amount obtained in the case where the hydrogen plasma treatment is not performed.

In the foregoing examples, since the μc-Si film is formed within a region 50 nm or less away from the insulting film, the channel layer is formed in the vicinity of the insulating film, so that the field-effect mobility is improved. Such effects are remarkable within a region 50 nm or less away from the insulating film. On the other hand, even if the μc-Si film is informed in a region away from the insulating film by more than 50 nm and the crystallinity in the portion has been improved, the field-effect mobility can not be improved easily.

In Examples 2 and 3, a TFT having a coplanar structure has been described Recently, a TFT having a stagger structure has been developed because it is easy to simplify the fabrication process. In forming a TFT 1300 having a stagger structure shown in FIG. 13; an ITO film 1307 including the source and the drain electrodes is first formed. Then, in order to obtain an ohmic contact with the i-type silicon film 1304, phosphorus ions are selectively formed on the ITO source and drain electrodes by decomposing with plasma PH$_3$ in the P-CVD apparatus. Next, an i-type μc-Si film 1304 is formed in the same way as the TFT having a coplanar structure. Then, a gate insulating film 1303 and a gate electrode film 1302 are formed. The TFT thus formed also exhibits similar characteristics to those of the TFT having a coplanar structure.

In the TFT having a coplanar structure and the TFT having the stagger structure described above, the channel region is formed on an opposite side to the glass substrate with respect to the semiconductor film. The quality of a silicon film is improved as the thickness of the film increases, and the channel region is formed in a region where the quality of a silicon film is satisfactory. Therefore, although the conductivity of the TFT having the coplanar or the stagger structure is lower (e.g., 5×10$^{-10}$ S/cm) than That of a TFT having a reversed stagger structure (e.g., 5×10$^{-9}$ S/cm), a TFT exhibiting satisfactory characteristics can be fabricated.

As described above, in a TFT having a coplanar structure and a TFT having a stagger structure, portions of the intrinsic microcrystalline silicon having an improved crystallinity serve as channel regions. Therefore, a field-effect mobility of the channel regions can be improved, resulting in an increase in the ON current of the TFT as compared to a conventional TFT as disclosed in Japanese Laid-Open Patent Publication Nos. 59-141271 and 61-59873. In addition, according to the present invention, it is sufficient to deposit a single-layered silicon with a thickness of about 50 nm, so that the time period required for depositing the silicon film becomes 600 seconds at a typical deposition rate. In other words, the present invention can shorten the time necessary for the deposition of the silicon film by about 30%. As a result, the throughput can be considerably improved. Moreover, in Examples 2 and 3, the intrinsic semiconductor layer is formed of a single material without mixing a plurality of materials. Therefore, in Examples 2 and 3, the semiconductor layer having a large field-effect mobility can be obtained easier than in Japanese Laid-Open Patent Publication No. 60-96680.

EXAMPLE 4

Next, the present invention will be described as being applied to a TFT having a reversed stagger structure with reference to the drawings.

Figure 14:
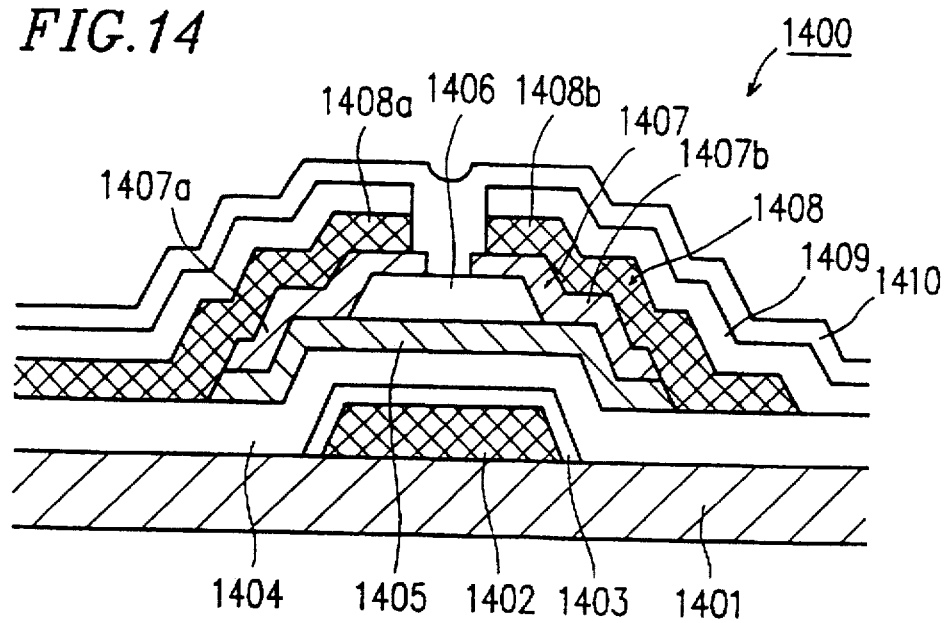
FIG. 14 is a cross-sectional view showing a TFT having a reversed stagger structure according to an example of the present invention.

FIG. 14 is a cross-sectional view of a substrate where a TFT is formed for a liquid crystal display (hereinafter, simply referred to as a TFT substrate). The TFT 1400 includes: a gate electrode 1402; insulating films 1403 and 1404; a semiconductor film 1405; an etching stopper film 1406; contact layers 1407a and 1407b formed of low-resistance semiconductor films; and a source electrode 1408a and a drain electrode 1408b. These films are formed in this order on an insulating substrate 1401. A transparent conductive film 1409 is further formed on the source and the drain electrodes 1408a and 1408b. By patterning the conductive film 1409 in a predetermined shape, a pixel electrode which is electrically connected to either one of the source electrode 1408a or the drain electrode 1408b.

Referring to FIG. 14, the process steps for forming the TFT 1400 will be described.

First, a Ta thin film (thickness: 300 nm) is formed on an insulating substrate 1401 such as a glass plate by a sputtering method. Then, the Ta thin film is patterned by a photolithography process and a dry etching process, thereby forming a gate electrode 1402. Next, the substrate 1401 is immersed in an ammonium tartrate solution or the like and an electric current is externally supplied, thereby anodizing the gate electrode 1402 and forming a $Ta_2O_5$ film (thickness about 300 nm) to be used as an insulating film 1403.

Subsequently, a silicon nitride ($Si_3N_4$) film to be used as an insulating film 1404, a microcrystalline silicon (μc-Si) film to be used as a semiconductor film 1405, and a silicon nitride ($Si_3N_4$) film to be used as an etching stopper film 1406 are formed by using a- PCVD apparatus having three reaction chambers of on inline system. First, by introducing monosilane ($SiH_4$), ammonia ($NH_3$), and hydrogen ($H_2$) into a first reaction chamber and discharging plasma, a $Si_3N_4$ film is formed over the entire surface of the substrate 1401 which is about 300 nm thick. Then, the substrate 1401 is conveyed to the second reaction chamber, and an i-type μC-Si film is formed over the entire surface of the substrate 1401 by introducing monosilane ($SiH_4$) and hydrogen ($H_2$) into the second reaction chamber. In this example, an i-type μc-Si film with a thickness of 50 nm is formed at a deposition rate of 3 nm/minute under the conditions there the flow rate of $SiH_4$ is 30 sccm, the flow rate of $H_2$ is 3000 sccm, and the RF power is 180 W. The conductivity of the resulting i-type μc-Si film is $5 \times 10^{-8}$ S/cm.

Hereinafter, the conditions for forming the μc-Si film will be described. In order to obtain a microcrystalline structure, it is important to control the hydrogen dilution ratio, i e., $H_2/SiH_4$ ratio in this example. Table 3 shows the hydrogen dilution ratios and the supplied RF powers when an i-type μc-Si film (thickness: 50 nm) is formed, and the conductivity of the resulting μc-Si film. The present inventors have confirmed by a transmission type electron beam diffraction method that a Si film having the conductivity of $5 \times 10^{-10}$ S/cm or more has a microcrystalline structure.

TABLE 3

Conductivity of i-type μc-Si film (S/cm) (Thickness: 50 nm)

| SiH4 | H2 | Hydrogen dilution ratio | RF power (W) | | | | |
|---|---|---|---|---|---|---|---|
| (sccm) | (sccm) | | 80 | 100 | 120 | 150 | 180 |
| 70 | 3000 | 43 | 1.2E-12 | — | 2.5E-12 | — | 5.0E-10 |
| 50 | 3000 | 60 | — | — | — | 4.9E-11 | 8.0E-10 |
| 40 | 3000 | 75 | — | — | 1.5E-09 | — | 3.0E-09 |

TABLE 3-continued

Conductivity of i-type μc-Si film (S/cm) (Thickness: 50 nm)

| SiH4 | H2 | Hydrogen dilution ratio | RF power (W) | | | | |
|---|---|---|---|---|---|---|---|
| (sccm) | (sccm) | | 80 | 100 | 120 | 150 | 180 |
| 30 | 3000 | 100 | — | 6.4E-08 | — | — | 5.0E-08 |
| 15 | 3000 | 200 | 2.0E-09 | 5.0E-09 | 7.5E-09 | 1.0E-08 | 8.0E-08 |

Figure 18:
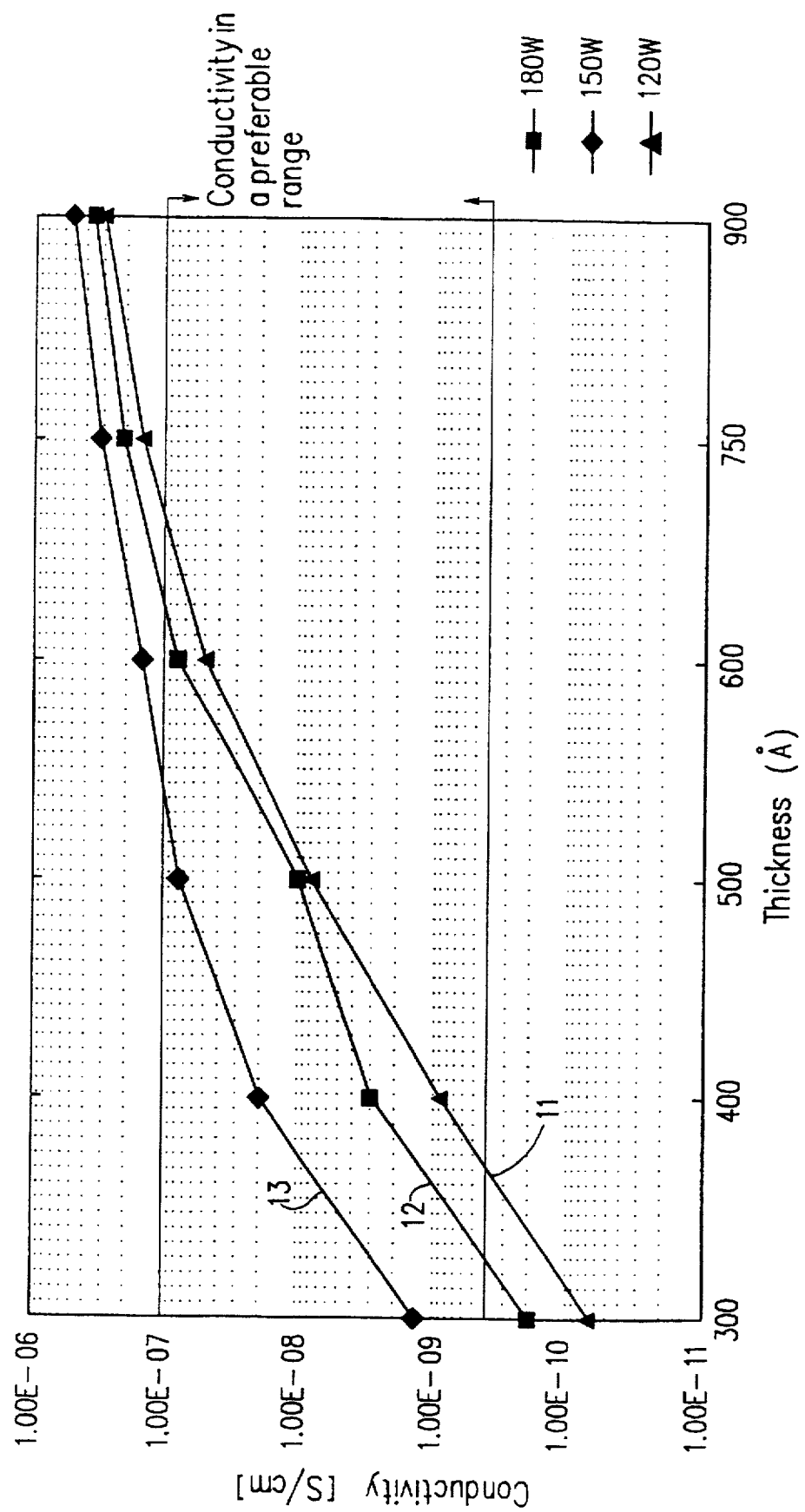
FIG. 18 is a graph showing the variation in the thickness and the conductivity of the Si film when the RF power to be supplied is changed.

As is apparent front Table 3, by setting the hydrogen dilution ratio to be 40 or more, it is possible to obtain an i-type μc-Si film having a conductivity of $5 \times 10^{-10}$ S/cm or more. In addition, if the RF power to be supplied, as well as the hydrogen dilution ratio, are set to be high, then it becomes easier to obtain a microcrystalline structure as shown in Table 3. Though not shown in Table 3, under the conditions where the flow rate of $SiH_4$ is 15 sccm, the flow rate of $H_2$ is 3000 sccm, and the RF power is 250 W, an i-type μc-Si film having a conductivity of $2 \times 10^{-7}$ S/cm can be obtained FIG 18 shows the relationship between the thickness and the conductivity of the resulting μc-Si film to be varied when the RF power to be supplied is changed. In FIG. 18, the glow rate of $SiH_4$ is set to be 15 sccm, the flow rate of $H_2$ is set to be 3000 sccm, and the RF power at three levels of 120 W, 150 W and 180 W is supplied. The variations in the conductivity corresponding to the RF power of 120 W, 150 W and 180 W are indicated by the curves 11, 12 and 13, respectively. In the third example, a microcrystalline structure can be obtained easily by performing a hydrogen plasma treatment, and the present inventors confirm that a Si film with a thickness of 30 nm is microcrystallized. However, it is difficult to obtain a microcrystalline structure by deposition under conditions of high hydrogen dilution ratio and high power as described in the present example, and only in the case where RF power of 180 W is supplied the resulting conductivity is approximately $1.5 \times 10^{-9}$ S/cm. As is apparent from FIG. 18, as the thickness of the Si film increases, the conductivity of the Si film considerably increases. Therefore, according to the method of the present example, it is also possible to obtain a microcrystalline structure when the thickness of the Si film is set to be 50 nm or less.

After the i-type μc-Si film is formed, by introducing monosilane ($SiH_4$), ammonia (NH), and hydrogen ($H_2$) into a third reaction chamber and discharging plasma, an $Si_3N_4$ film to be used as an etching stopper layer 1406 is formed over the entire surface of the substrate 1401 which is about 300 nm thick.

After forming the $Si_3N_4$ film, the i-type μc-Si film and the $Si_3N_4$ film by using the P-CVD apparatus in the above-described manner, the etching stopper layer 1406 is formed by patterning the uppermost $Si_3N_4$ film. Subsequently, an $n^+$-type a-Si film is formed over the substrate 1401 under such a state, and the $n^+$-type a-Si film and the i-type μc-Si film already formed are patterned in a predetermined shape, thereby forming a semiconductor film 1405 and the contact layers 1407a and 1407b. Next, a titanium (Ti) film is deposited over the entire surface of the substrate 1401 by a sputtering method and then patterned, thereby forming a source electrode 1408a and a drain electrode 1408b. In the TFT 1400 of this example, the channel length is set to be 10 μm and the channel width is set to be 40 μm.

Thereafter, by performing the sputtering using indium tin oxide (ITO) containing 5% tin (Sn) as a target an oxygen environment, an ITO film 1409 is deposited on the substrate 1401 so as to be about 70 nm thick, and then patterned, thereby forming a pixel electrode.

Finally, a $Si_3N_4$ film is formed as a protection film 1410, and then patterned, thereby forming a substrate where a TFT is formed (or a TFT substrate) or a pair of substrates constituting a liquid crystal display.

Figure 19:
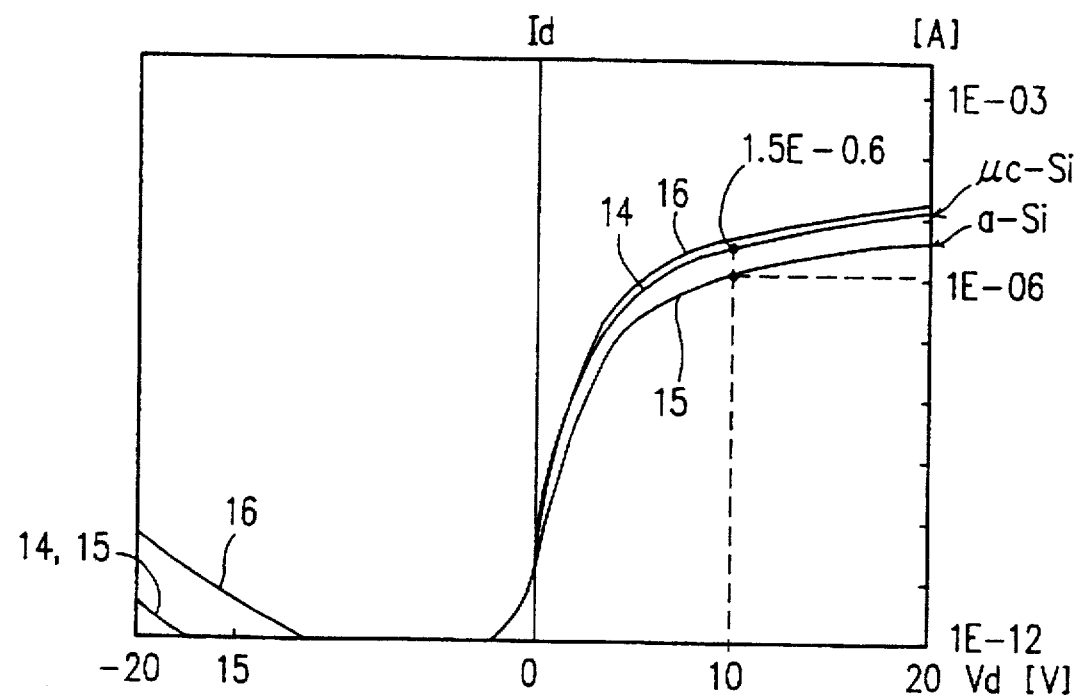
FIG. 19 is a graph showing the variation in the ON current of a TFT according to the example of the present invention and a conventional TFT using an a-Si film.
Figure 20:
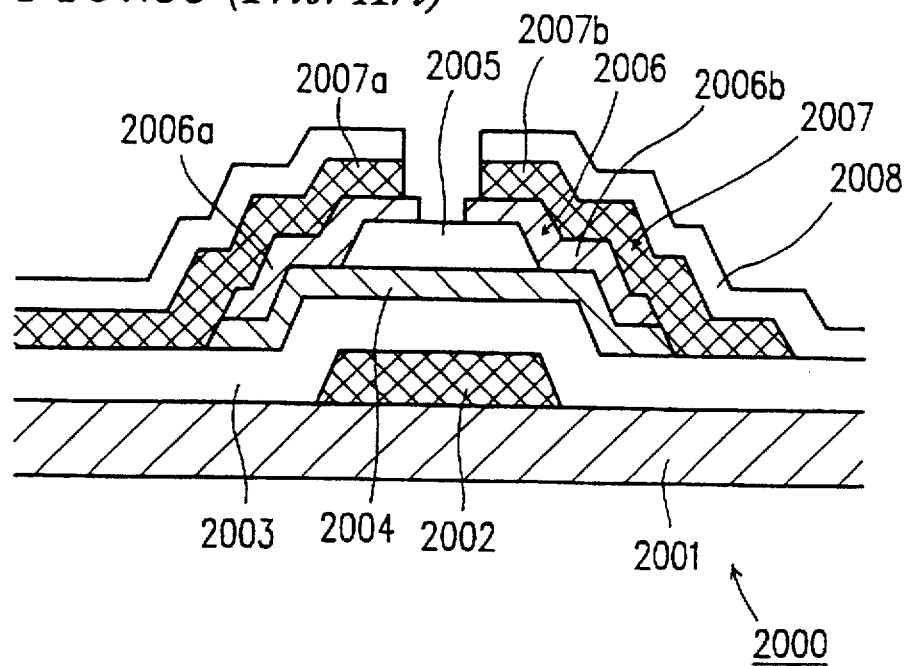
FIG. 20 is a cross-sectional view showing a TFT according to a first conventional example.
Figure 21:
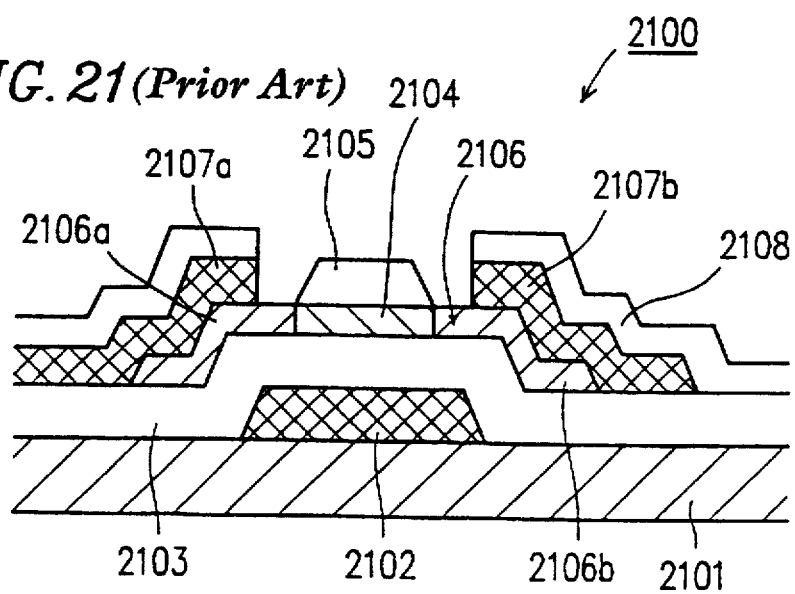
FIG. 21 is a cross-sectional view showing a TFT according to a second conventional example.

FIG. 19 shows the characteristics of the TFT 1400 formed by performing the above process steps based on the measurement results. In FIG. 19, the ordinates indicate the drain current value, and the abscissas indicate the voltage to be applied to the drain electrode 1408b of the TFT 1400 The curve 14 shows the variation in the current caused by varying the gate voltage in the TFT 1400 using the semiconductor film 1405 formed under the above-described conditions, i.e., the i-type μc-Si film having a conductivity of $5\times10^{-8}$ S/cm, while the curve 15 shows the variation in the current caused by varying the gate voltage in a conventional TFT using an a-Si film as the semiconductor film. As shown in FIG. 19, in the TFT 1400, when the gate voltage is +10 V and the a source-drain voltage is to V, the resulting ON current becomes $1.5\times10^{-6}$ A. This value of the ON current is about 1.5 times as large as that or a conventional TFT obtained than substantially the same gate voltage and source-drain voltage are applied to the TFT. On the other hand, the OFF current in the TFT 1400 is measured to be about $10\times10^{-12}$ A or lees when the gate voltage is $-15$ V and the source-drain voltage is 10 V. The OFF current is almost always about $1.0\times10^{-13}$ A.

Furthermore, the curve 16 shows the variation in the current caused by varying the gate voltage in the TFT formed by performing almost the sate process steps except for using an i-type μc-Si film having a conductivity of $1\times10^{-7}$ S/cm as a semiconductor film. In such a TFT, as shown in FIG. 19, when the gate voltage is +10 V and the source-drain voltage is 10 V, the ON current becomes approximately $1.8\times10^{-6}$ A. On the other hand, when the gate voltage is $-15$ V and the source-drain voltage is 10 V, the OFF current becomes approximately $5\times10^{-12}$ A. It is not preferable to use a TFT having an OFF current of $1\times10^{-12}$ A or more as a switching element of a liquid crystal display. The reason is as follows. In a liquid crystal display using a TFT having an OFF current of $1\times10^{-12}$ A or more, even if the pixels are charged for conducting a display, the discharge from the pixels is generated before charging the pixels next time. As a result, the potential of the pixels where the discharge has been generated is reduced, and the pixels are displayed as bright spots. A contact characteristic between an i-type semiconductor and an $n^+$-type semiconductor in a reverse voltage bias and the resistance value of the i-type semiconductor are important factors in determining the OFF current. In the case of using an i-type μc-Si film having a conductivity of $1\times10^{-7}$ s/cm or more as a semiconductor film for a TFT, the OFF current possibly increases for the following reasons: first, since the characteristics in the interface between an i-type μc-Si film and an $n^+$-type semiconductor film are not satisfactory, the contact characteristics in a reverse voltage bias, i.e., current-limiting characteristics in a reverse voltage bias are degraded, and second, the value of the resistance in the μc-Si film is too low.

As is apparent from the foregoing description, in the case of using a TFT having a reversed stagger structure as a switching element for a liquid crystal display, if an i-type μc-Si film having a conductivity in a range of $5\times10^{-10}$ S/cm to $1\times10^{-7}$ S/cm is used as a semiconductor film for a TFT, then it is possible to increase the ON current and suppress the OFF current to a lower level.

An insulating substrate, and a counter substrate having a black matrix formed on the insulating substrate and an ITO electrode formed thereon are attached to the TFT substrate shown in FIG. 14 so as to be spaced apart by a predetermined gap, and then liquid crystal is injected into the gap. Subsequently, polarizers are attached to the surface of the TFT substrate not facing the liquid crystal and to the surface of the counter substrate not facing the liquid crystal, respectively, and a back light is provided, thereby completing a liquid crystal display. Depending upon the necessity, a color filter layer can be provided on the counter substrate.

EXAMPLE 5

Next, another exemplary TFT having a reversed stagger structure will be described with reference to FIG. 15. The TFT 1500 shown in FIG. 5 is different from the TFT 1400 shown in FIG. 14 in that a contact layer functioning as a low-resistance semiconductor layer is formed by an ion doping method.

Hereinafter, the process steps for forming the TFT 1500 will be briefly described. First, a gate electrode 1502 made of Ta and a $Ta_2O_5$ film 1503 functioning as an insulating film are formed on an insulating substrate 1501 such as a glass plane in the same way as in the TFT 1400 described above. Subsequently, a silicon nitride ($Si_3N_4$) film to be used as an insulating film 1504, an i-type μc-Si film to be used as a semiconductor film 1505, and a silicon nitride ($Si_3N_4$) film to be used as an etching stopper layer 1506 are formed by using a P-CVD apparatus hating three reaction chambers of an in-line system. In this example, an i-type μc-Si film having a conductivity of $5\times10^{-8}$ S/cm is formed under the same conditions as those for forming the i-type μc-Si film in the TFT 1400.

By patterning the uppermost $Si_3N_4$ film of the substrate 1501 under this state, an etching stopper layer 1506 is formed. Subsequently, by doping $PH_3$ ions using the etching stopper layer 1506 as a mask, an $n^+$-type μc-Si film to be used as contact portions 1507a and 1507b is formed. In the case where the conductivity of the i-type μc-Si film 1505 is $5\times10^{-10}$ S/cm or more, the conductivity of the Si film which has been doped with ions becomes $1\times10^{-2}$ S/cm or more. Consequently, the voltage drop in these contact portions 1507a and 1507b is small enough to be neglected.

Next, a titanium (Ti) film is deposited over the entire surface of the substrate 1601 by a sputtering method and than patterned, thereby forming a source electrode 1508a and a drain electrode 1508b. In the TFT 1500 of this example, the channel length is set to be 10 μm and the channel width is set to be 40 μm.

Figure 15:
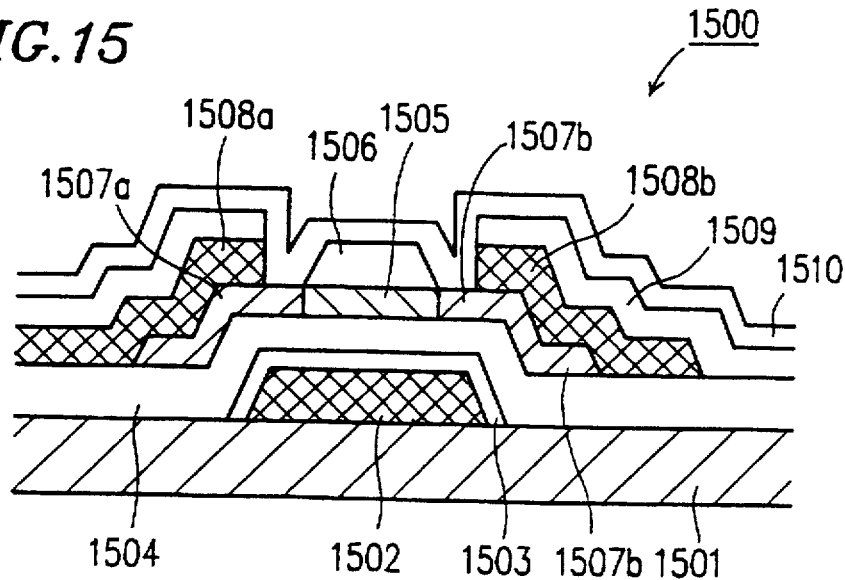
FIG. 15 is a cross-sectional view showing a TFT having a reversed stagger structure according to still another example of the present invention.

Thereafter, an ITO film functioning as a pixel electrode 1509 and a $Si_3N_4$ film functioning as a protection film 1510 are formed and then patterned, thereby completing a TFT substrate shown in FIG. 15.

The characteristics of the TFT 1500 under this state are measured than the gate voltage is +10 V and the source-drain voltage is 10 V, the ON current becomes $1.5\times10^{-6}$ A or more. On the other hand, when the gate voltage is $-15$ V and the source-drain voltage is 10 V, the OFF current becomes less than $1\times10^{-12}$ A. Thus the characteristics of the TFT 1500 are similar to those of the TFT 1400. In the case of using an i-type μc-Si film having a conductivity of $1\times10^{-7}$ S/cm as a semiconductor film 1505 for the TFT 1500, when the gate voltage is $-15$ V and the source-drain voltage is 10 V, the OFF current in the TFT 1500 becomes $1\times10^{-11}$ A. The reason for this is that in the TFT 1500 using the i-type μc-Si film having a conductivity of $1\times10^{-7}$ S/cm as a semiconductor film 1505, since the characteristics in the interface between the i-type μc-Si film and an n$^+$-type μc-Si film formed by doping the i-type μc-Si film with the ions are not satisfactory, a leak current has possibly been generated in the case where a reverse bias voltage is applied.

As is apparent from the foregoing description, in the case of using a TFT 1500 having a structure shown in FIG. 15, if an i-type μc-Si film having a conductivity in a range of $5\times10^{-10}$ S/cm to $1\times10^{-7}$ S/cm is used as a semiconductor film for the TFT, then it is possible to increase the ON current and suppress the OFF current to a lower level.

EXAMPLE 6

Figure 13:
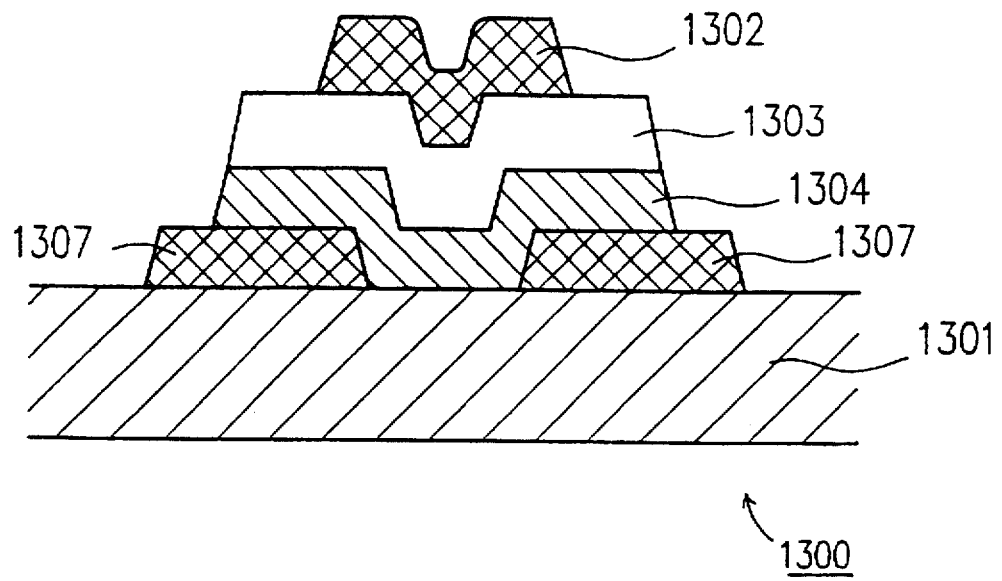
FIG. 13 is a cross-sectional view showing a TFT having a stagger structure according to another example of the present invention.

Next, a TFT 1600 having a stagger structure different from that of the TFT having a stagger structure shown in FIG. 13 will be described with reference to FIG. 16. FIG. 16 is a cross-sectional view of a TFT substrate for a liquid crystal display including a TFT 1600 having a stagger structure. The process for forming the TFT substrate will be described below.

First, a metallic film (thickness: 250 nm) made of tantalum (Ta), titanium (Ti) or the like is deposited by a sputtering method on an insulating substrate 1601, such as a glass plate, and then patterned in an island-shape, thereby forming a light-shielding film 1602. Then, as an insulating film 1603 covering the light-shielding film 1602, a silicon oxide film (thickness: 250 nm) is formed by a sputtering method or a P-CVD method. Net, a tantalum (Ta) film (thickness: 300 nm) is deposited over the entire surface of the substrate 1601 by a sputtering method end then patterned, thereby forming a source electrode 1604a and a drain electrode 1604b.

Subsequently, an n-type μc-Si film having a conductivity of 0.5 S/cut is formed as low-resistance semiconductor films 1605a and 1606b doped with impurity ions by using a P-CVD apparatus The n-type μc-Si film is formed by introducing a SiH$_4$ gas, a H$_2$ gas and a PH$_3$ gas into the P-CVD apparatus so that the hydrogen dilution ratio, i.e. H$_2$/SiH$_4$ ratio becomes approximately 100, and discharging plasma. After the n-type μc-Si film thus formed is patterned in a desired shape, an i-type μc-Si film (thickness: 50 nm) is formed by a P-CVD method. The i-type μc-Si film is deposited under the same conditions as those of the i-type μc-Si film of the TFTs 1400 and 1500 having a reversed stagger structure shown in FIGS. 14 and 15, respectively. As a result, an i-type μc-Si film having a conductivity of $5\times10^{-8}$ S/cm is obtained. Thereafter, this i-type μc-Si film is patterned in an island shape so as to be used as a semiconductor film 1606.

Next, a transparent conductive film such as an ITO film is deposited on the substrate 1601 by a sputtering method so as to be 200 nm thick, and then patterned, thereby forming a pixel electrode 1607 partially overlapping with the drain electrode 1604b. Then, a Si$_3$N$_4$ film (thickness: 250 nm) to be used as a gate insulating film 1608 is formed by a P-CVD method. Thereafter, a titanium (Ti) film (thickness: 300 nm) is deposited on the gate insulating film 1608 by a sputtering method, and then patterned, thereby forming a gate electrode 1609. Finally, a Si$_3$N$_4$ film (thickness: 250 mn) to be used as a protection film 1610 is formed by a P-CVD method, thereby completing the TFT substrate.

The characteristics of the TFT 1600 under this state are measured. When the gate voltage is +10 V and the source-drain voltage is 10 V, the ON current becomes $1.3\times10^{-6}$ A or more. On the other hand, when the gate voltage is -15 V and the source-drain voltage is 10 V, the OFF current becomes $1\times10^{-12}$ A or less. Thus the characteristics of the TFT 1600 are similar to those of the TFTs 1400 and 1600 hating the reversed stagger structure described above. In the case of using an i-type μc-Si film having a conductivity of $1\times10^{-7}$ S/cm as a semiconductor film 1606 for she TFT 1600, the resulting ON current becomes substantially equal to that in the case of using an i-type μc-Si film having a conductivity of $5\times10^{-8}$ S/cm. However, when the gate voltage is -15 V and the source-drain voltage is 10 V, the OFF current in the TFT 1600 becomes $8\times10^{-12}$ A.

As is apparent from the foregoing description, in the case of using a TFT 1600 having a stagger structure shown in FIG. 16, it an i-type μc-Si film having a conductivity in a range of $5\times10^{-10}$ S/cm to $1\times10^{-7}$ S/cm is used as a semiconductor film for the TFT, their it is possible to increase the ON current and suppress the OFF current to a lower level.

EXAMPLE 7

In this example, referring to FIG. 17, a TFT 1700 having a coplanar structure in which a method for forming an i-type μc-Si film is different from that in the TFT 1200 hating a coplanar structure shown in FIG. 12, will be described In TFT 1700, contact region 1705 are formed by doping an i-type semiconductor layer to be used as a channel region 1704 with ions, in the same way as in the TFT 1200 shown in FIG. 12, and then a source electrode 1710a and a drain electrode 1710b are formed.

Hereinafter, referring to FIG. 17, the process steps for forming the TFT 1700 will be described.

First, a metallic film is deposited on an insulating substrate 1701 such as a transparent glass plate, and then patterned in an island-shape, thereby forming a light-shielding film 1702. Then, an insulating film 1703 covering the light-shielding film 1702 is formed over the entire surface of the substrate 1701. A SiO$_2$ film or the like is used as the insulating film 1703. Next, an i-type μc-Si film is formed on the insulating film 1703 in the same way as in the second example. In this example, an i-type μc-Si film having a conductivity of $5\times10^{-8}$ S/cm and a thickness or 50 nm is formed under the conditions where the flow rate of SiH$_4$ is 30 sccm, the flow rate of H$_2$ is 3000 sccm, and the RF power it 180 W.

After the i-type μc-Si film thus formed is etched in an island shape, a gate insulating film 1706 is formed thereon. An Si$_3$N$_4$ film or an SiO$_2$ film is used as the gate insulating film 1706. In this example, an SiO$_2$ film is formed by a P-CVD method so as to be 250 nm thick. Subsequently, after a gate electrode 1707 formed of an aluminum (Al) film is formed on SiO, film 1706, the contact regions 1705 are formed by doping an i-type μc-Si film with ions using the gate electrode 1707 as a mask. Thereafter, an interlevel insulating film 1708 is formed over the entire surface of the substrate 1701, and a transparent conductive film such as an ITO film is formed on the interlevel insulating film 1708 by a sputtering method. By etching this transparent conductive film, a pixel electrode 1709 can be obtained.

Subsequently, a pair of contact holes are formed through the gate insulating film 1706 and the interlevel insulating film 1708 by patterning and etching, go as to partially expose the contact regions 1705. Under such a state, a metallic film made of aluminum alloy, titanium or the like is formed by a sputtering method, and then patterned, thereby forming a source electrode 1710a and a drain electrode 1710b which are electrically connected to the contact regions 1705, respectively. By performing these process steps, a TFT substrate (or a substrate where a TFT is formed) of a pair of substrates constituting a liquid crystal panel is completed.

In the TFT 1700 shown in FIG. 17, all of the gate electrode 1707, the source electrode 1710a and the drain electrode 1710b can be formed in later process steps for forming the TFT 1700. Accordingly, it is easier to use an aluminum alloy while suppressing the adverse effects of a hillock or the like. In order to improve the reliability and the reproducibility, a protection film can also be formed on the TFT 1700 shown in FIG. 17.

The characteristics of the TFT 1700 using an i-type μc-Si film having a conductivity of $5 \times 10^{-8}$ S/cm under this state are measured. When the gate voltage is +10 V and the source-drain voltage is 10 V, the ON current becomes $1.5 \times 10^{-6}$ A or more, and when the gate voltage is −15 V and the source-drain voltage is 10 V, the OFF current becomes $10^{-12}$ A or less. On the other hand, the characteristics of the TFT 1700 using an i-type μc-Si film having a conductivity of $1 \times 10^{-7}$ S/cm or more are also measured. As a result, when the gate voltage is +10 V and the source-drain voltage is 10 V, the ON current becomes $2.1 \times 10^{-6}$ A or more, and when the gate voltage is −15 V and the source-drain voltage is 10 V, the OFF current becomes $9 \times 10^{-12}$ A.

As described above, in the case of using an i-type μc-Si film for a TFT 1700 having a coplanar structure shown in FIG. 17, if the conductivity of the i-type μc-Si film is set to be in a range of $5 \times 10^{-10}$ S/cm to $1 \times 10^{-7}$ S/cm, then it is possible to increase the ON current and suppress the OFF current to a lower level.

As is apparent from the foregoing description, since an i-type μc-Si film has not only a high conductivity but also a large field-effect mobility as obviously shown in the characteristics of the TFT using such a film, an i-type μc-Si film can be advantageously applied to various kinds of thin-film semiconductor devices where the electrons have some mobility.

The present invention is applicable to various kinds of thin-film semiconductor devices such as a thin-film diode, a thin-film transistor (TFT), a thin-film solar cell, a thin-film photo diode, a thin-film photo diode array, and a driver using a TFT.

In a thin-film semiconductor device of the present invention since an i-type μc-Si film with an improved field-effect mobility is used, it is possible to increase the amount of the ON current by 1.5 times as compared with that of a conventional thin-film semiconductor device using an a-Si film. In the case of using a thin-film semiconductor device of the present invention for a 10.4-inch VGA, the opening ratio of the 10.4-inch VGA can be increased from 60% in a VGA using a conventional thin-film semiconductor device up to 65%, thereby improving the brightness of the VGA. In addition, by using a thin-film semiconductor device of the present invention, it is possible to fabricate easily a 16-inch liquid crystal display used for an engineering work station consisting of 1280×31024 pixels which couldn't be fabricated easily according to a conventional technique.

In the foregoing examples, a microcrystalline silicon film is used as a semiconductor film for a thin-film semiconductor device. Alternatively, microcrystalline semiconductor films made of a material such as silicon germanium ($SiC_x$, where $0 \leq x \leq 1$), silicon carbon ($SiC_x$, where $0 \leq x \leq 1$), silicon nitride ($Si_3N_{4-x}$, where $0 \leq x \leq 4$), or silicon oxide ($SiO_{2-x}$, where $0 \leq x \leq 2$) can also be used. In such cases, the same effects as those of the above-described example can be attained.

According to the present invention, a single-layered silicon film can be formed without adding any other material, so that a film having a large field-effect mobility can be obtained easily.

According to the method of the present invention, by repeating the process step of forming a silicon film, instead of an amorphous silicon film conventionally formed, on a substrate by decomposing with plasma a material gas containing silicon elements introduced into a reaction chamber of a plasma chemical vapor deposition apparatus, and the process step of treating the silicon film with hydrogen plasma by introducing hydrogen gas into the reaction chamber, a silicon film having a microcrystalline structure with a predetermined characteristics is formed. Alternatively, a silicon film having a microcrystalline structure with a predetermined characteristics is formed by deposition under the condition of high hydrogen dilution ratio and high power. As a result, a TFT having a higher field-effect mobility as compared with a conventional one can be formed. Accordingly, as compared with a conventional semiconductor device using an amorphous semiconductor thin film, a smaller sized semiconductor device can be formed.

In addition, according to the present invention, in a device having a coplanar, stagger, or a reversed stagger structure, it is possible to increase the ON current as compared with that of a conventional semiconductor device using an amorphous semiconductor thin film, while suppressing the OFF current to a lower level. As a result, a large-scale high-definition liquid crystal display having a high numerical aperture can be fabricated.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A thin film transistor comprising:

a substrate;

a semiconductor film formed above the substrate;

an insulating film formed on the semiconductor substrate;

a gate electrode formed on the insulating film; and a source and a drain electrode connected to the semiconductor film, wherein at least a portion of the semiconductor film has a microcrystalline structure with a dark conductivity in a range of about $5 \times 10^{-10}$ S/cm to about $1 \times 10^{-7}$ S/cm, and wherein the semiconductor film includes a channel portion of i-type silicon.

2. A thin film transistor according to claim 1, wherein the semiconductor film includes a pair of doped regions arranged to sandwich the channel portion, and the doped regions include impurities doped by ion doping.

3. A thin film transistor according to claim 1, wherein an amount of bound hydrogen in the portion having the microcrystalline structure is in the range of about 7% to about 10%.

4. A thin film transistor according to claim 1, wherein a crystalline volume fraction in the portion having the microcrystalline structure is in the range of about 8% to about 70%.

5. A thin film transistor according to claim 1, wherein the portion having the microcrystalline structure has an absorption coefficient for light with a wavelength of 400 nm of about $3.7 \times 10^5$ cm$^{-1}$ or less.

6. A thin film transistor according to claim 1, wherein, in the portion having the microcrystalline structure, a {111} axis of a plurality of crystalline grains is perpendicular to the substrate.

7. A thin film transistor according to claim 1, wherein the semiconductor film includes a film made of at least one of silicon, silicon germanium, silicon carbon, silicon nitride and silicon oxide.

* * * * *